US008308979B2

(12) United States Patent  
Ishino et al.

(10) Patent No.: US 8,308,979 B2
(45) Date of Patent: Nov. 13, 2012

(54) INK FOR ORGANIC ELECTROLUMINESCENT DEVICE, MANUFACTURING METHOD OF ORGANIC ELECTROLUMINESCENT DEVICE, ORGANIC DISPLAY PANEL, ORGANIC DISPLAY APPARATUS, ORGANIC ELECTROLUMINESCENT APPARATUS, INK, FORMING METHOD OF FUNCTIONAL LAYER, AND ORGANIC ELECTROLUMINESCENT DEVICE

(75) Inventors: Shinichiro Ishino, Osaka (JP); Tomoki Masuda, Osaka (JP); Hirotaka Nanno, Kyoto (JP); Yuko Kawanami, Osaka (JP); Noriyuki Matsusue, Osaka (JP); Mituru Harada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/217,559

(22) Filed: Aug. 25, 2011

(65) Prior Publication Data

US 2012/0001124 A1 Jan. 5, 2012

Related U.S. Application Data

(63) Continuation of application No. PCT/JP2010/004334, filed on Jul. 1, 2010.

(51) Int. Cl.
*H05B 33/10* (2006.01)
*H01L 51/50* (2006.01)
(52) U.S. Cl. ............. 252/301.16; 252/500; 252/62.3 Q; 428/917
(58) Field of Classification Search ............. 252/301.16, 252/500, 62.3 Q; 428/917
See application file for complete search history.

(56) References Cited

U.S. PATENT DOCUMENTS

| 5,443,922 | A | 8/1995 | Nishizaki et al. |
| 2007/0173578 | A1 | 7/2007 | Spreitzer et al. |
| 2008/0265214 | A1 | 10/2008 | Steiger et al. |
| 2009/0033208 | A1* | 2/2009 | Nagayama et al. ........... 313/504 |

FOREIGN PATENT DOCUMENTS

| JP | 5-163488 | 6/1993 |
| JP | 2004-532096 | 10/2004 |
| JP | 2007-69140 | 3/2007 |
| JP | 2007-119574 | 5/2007 |
| JP | 2007-130990 | 5/2007 |
| JP | 2007-527624 | 9/2007 |
| JP | 2008-503870 | 2/2008 |
| JP | 2009-266824 | 11/2008 |
| JP | 2009-267299 | 11/2009 |
| WO | 02/069119 | 9/2002 |

OTHER PUBLICATIONS

Search report from International Search Report for PCT/JP2010/004334, mail date is Jan. 7, 2010.

* cited by examiner

*Primary Examiner* — Carol M Koslow
(74) *Attorney, Agent, or Firm* — Greenblum & Bernstein, P.L.C.

(57) ABSTRACT

An ink for an organic electroluminescent device includes a functional material, a first solvent, a second solvent, and a third solvent. The functional material is for forming a functional layer of the organic electroluminescent device. The first solvent is for dissolving the functional material. The second solvent has a diester backbone and a second boiling point that is at most equal to a first boiling point of the first solvent or greater than the first boiling point of the first solvent by at most 20° C. The third solvent is an aliphatic alcohol and has a third boiling point that is less than the first boiling point of the first solvent and less than the second boiling point of the second solvent.

11 Claims, 17 Drawing Sheets

$$\text{Flatness ratio} = \frac{\left(\begin{array}{c}\text{Maximum} \\ \text{thickness} \\ \text{value}\end{array} - \begin{array}{c}\text{Minimum} \\ \text{thickness} \\ \text{value}\end{array}\right) \div 2}{\text{Average thickness value}} \times 100$$

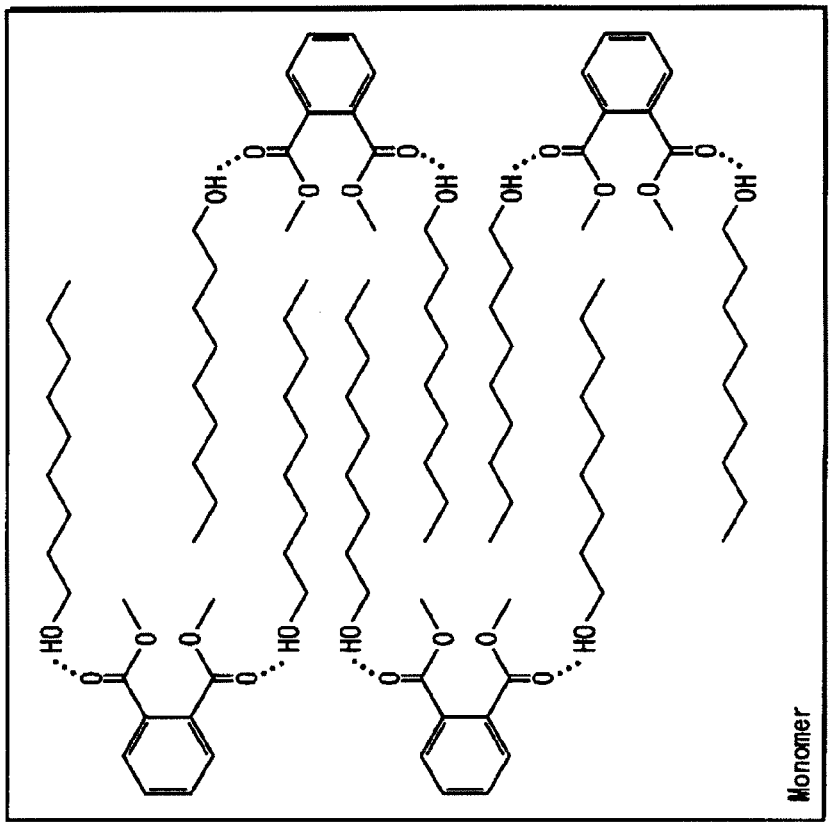
FIG. 9C  Diester + alcohol  Monomer
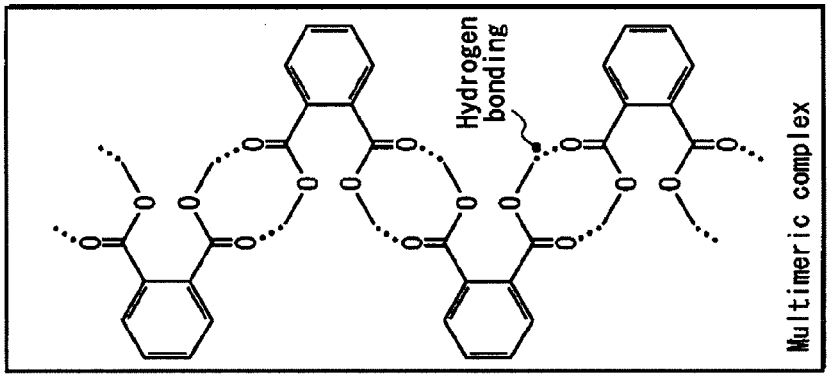
FIG. 9B  Diester alone  Multimeric complex
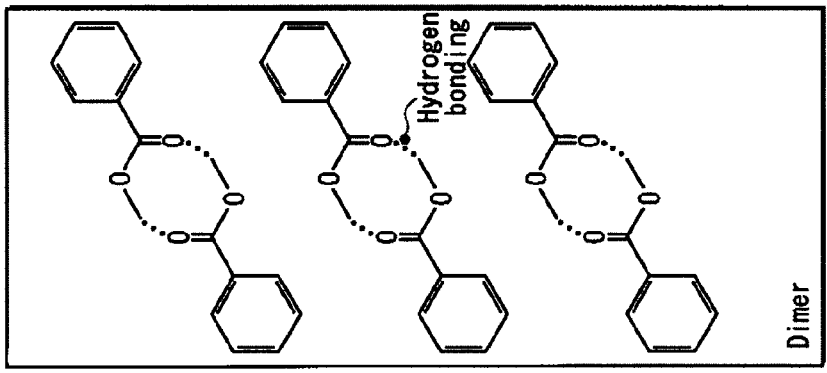
FIG. 9A  Monoester alone  Dimer FIG. 11
| Boiling point | 1st solvent ≈ 2nd solvent > 3rd solvent | 2nd solvent > 1st solvent > 3rd solvent | 1st solvent > 2nd solvent ≈ 3rd solvent |
|---|---|---|---|
| Ejectability | ○ | ○ | ○ |
| Flatness | 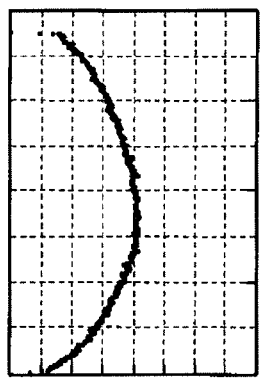 |  |  |

FIG. 12

| | Low | (Boiling point) | High |
|---|---|---|---|
| 1st solvent | | 260°C ⇔ 350°C | |
| 2nd solvent | | 280°C ⇔ 350°C | |
| 3rd solvent | 80°C ⇔ 250°C | | |

| | Low | (Viscosity) | High |
|---|---|---|---|
| 1st solvent | Not specified | | |
| 2nd solvent | Not specified | | |
| (1st+2nd) solvent | | 20mPa·s ⇔ 200mPa·s | |
| (1st+2nd+3rd) solvent | 3mPa·s ⇔ 20mPa·s  ▬▬▶ 13mPa·s | | 30mPa·s ▬▬▶ 200mPa·s |
| 3rd solvent | 3mPa·s Not specified | | |

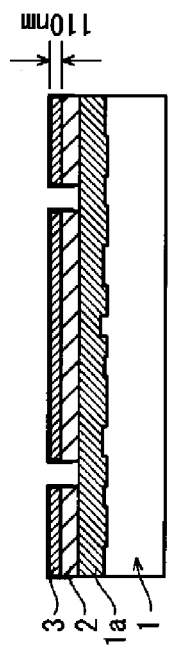
FIG. 16A Set substrate
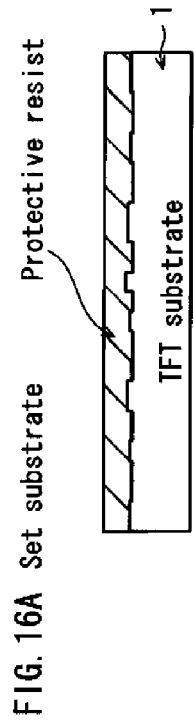
FIG. 16B Develop (remove protective resist)
FIG. 16C Form flatness film
FIG. 16D Form first anode electrode
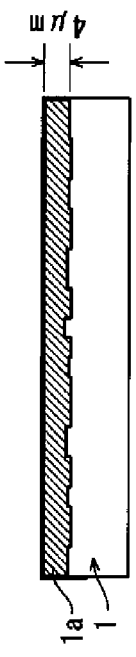
FIG. 16E Form second anode electrode
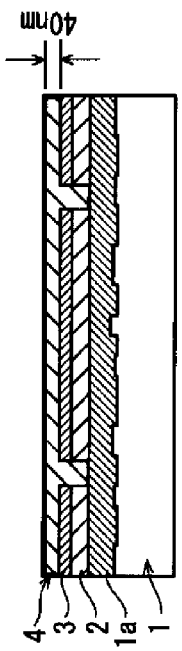
FIG. 16F Form hole injection layer
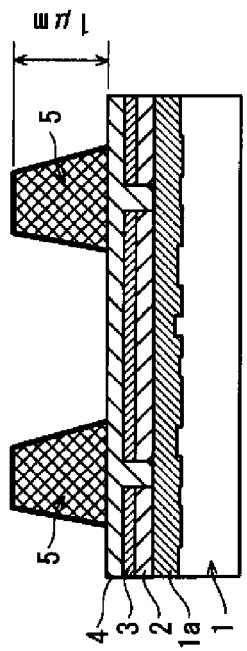
FIG. 16G Form banks

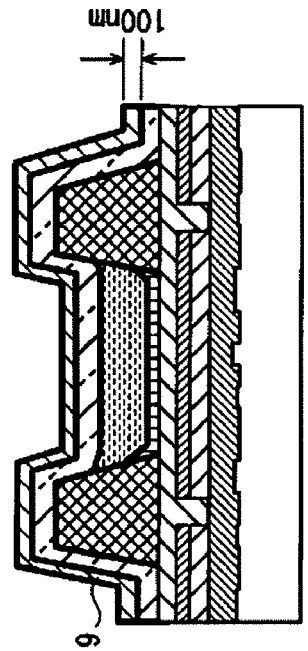
FIG. 17A Form hole transport layer
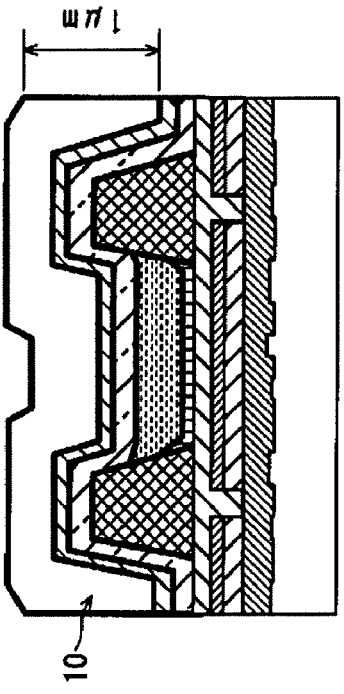
FIG. 17B Form light-emitting layer
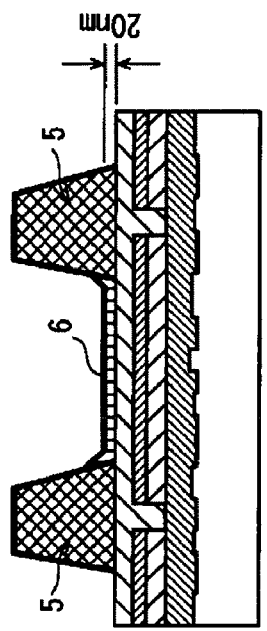
FIG. 17C Form electron transport layer
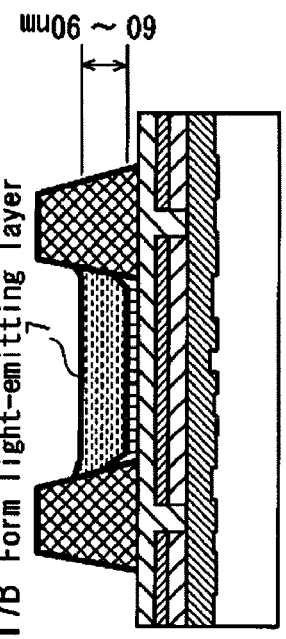
FIG. 17D Form cathode electrode
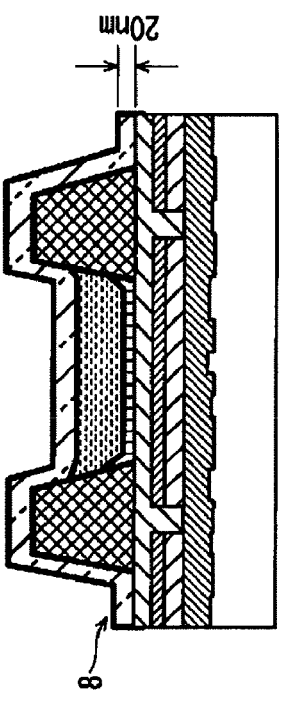
FIG. 17E Form sealing layer FIG. 20A
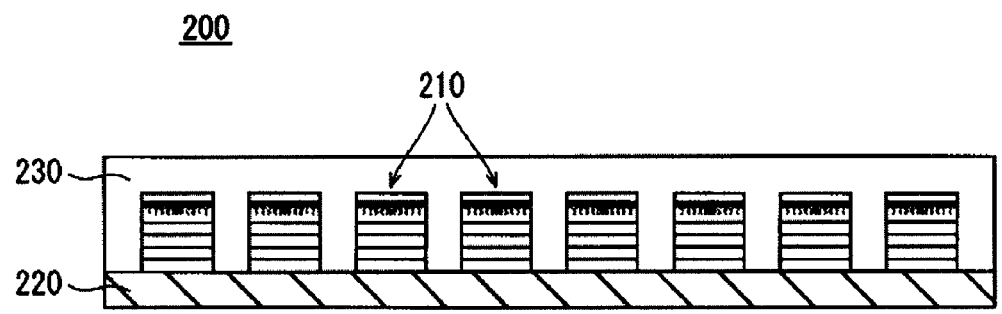
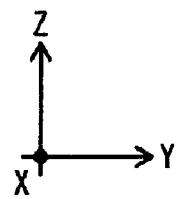
FIG. 20B
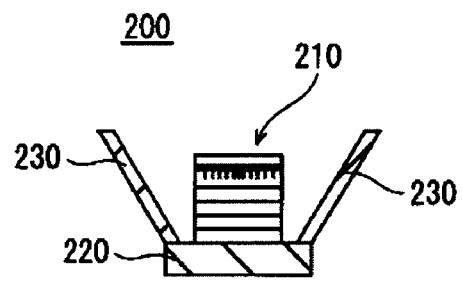
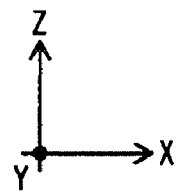

INK FOR ORGANIC ELECTROLUMINESCENT DEVICE, MANUFACTURING METHOD OF ORGANIC ELECTROLUMINESCENT DEVICE, ORGANIC DISPLAY PANEL, ORGANIC DISPLAY APPARATUS, ORGANIC ELECTROLUMINESCENT APPARATUS, INK, FORMING METHOD OF FUNCTIONAL LAYER, AND ORGANIC ELECTROLUMINESCENT DEVICE

CROSS REFERENCE TO RELATED APPLICATION

This is a continuation application of PCT Application No. PCT/JP2010/004334 filed Jul. 1, 2010, designating the United States of America, the disclosure of which, including the specification, drawings and claims, is incorporated herein by reference in its entirety.

BACKGROUND OF THE INVENTION

1. Field of the Invention

The present invention relates to an ink for an organic electroluminescent device, manufacturing method of an organic electroluminescent device, organic display panel, organic display apparatus, organic electroluminescent apparatus, ink, forming method of a functional layer, and organic electroluminescent device.

2. Description of the Related Art

In recent years, the research and development of the organic electroluminescent device have been performed actively. The organic electroluminescent device is a light-emitting device making use of the electroluminescent phenomenon of a functional material, and has a structure in which a functional layer formed of the functional material is inserted between a positive electrode and a negative electrode. In a manufacturing process of such an organic electroluminescent device, the vapor deposition method with masking is used to deposit the functional material on a substrate to form the functional layer.

Also, as another forming method of a functional layer, an ink application method has been proposed. In the ink application method, an ink is formed by dissolving the functional material into a solvent, the ink is ejected from an ink jet apparatus onto the substrate, and the solvent is caused to vaporize from the applied ink to form the functional layer (Patent Literature 1).

3. Patent Literature

[Patent Literature 1]: Japanese Patent Application Publication No. 2009-267299

SUMMARY OF THE INVENTION

Meanwhile, in the above ink application method, to obtain an organic electroluminescent device with excellent light-emitting characteristics, it is desired that the functional layer formed as described above has a uniform thickness. In view of this, preferably an equivalent amount of ink is filled into each pixel area. For this purpose, an ink having an excellent ejectability, namely, an ink which, when ejected from the ink jet apparatus, can land with high accuracy, is required. Also, even if an equivalent amount of ink can be filled into each pixel area, it is difficult to obtain a uniform layer thickness unless the upper surface of the functional layer is flat. Thus the ink is desired to have an excellent flatness as well.

However, the ejectability and the flatness are opposite characteristics of ink. That is to say, to improve the ejectability, the ink is required to be lower in viscosity, and to improve the flatness, the ink is required to be higher in viscosity. As of now, an ink which is excellent in both the ejectability and the flatness has not yet been realized.

It is therefore an object of the present invention to provide an ink for an organic electroluminescent device that is excellent in both the ejectability and the flatness.

To fulfill the above object, an ink for an organic electroluminescent device in one embodiment of the present invention comprises: a functional material for constituting a functional layer of the organic electroluminescent device; a first solvent dissolving the functional material; a second solvent which has a diester backbone and is equal to or lower than the first solvent in boiling point, or higher than the first solvent in boiling point by a difference of 20° C. or less; and a third solvent which is an aliphatic alcohol and is lower than the first solvent and the second solvent in boiling point.

The ink for an organic electroluminescent device in one embodiment of the present invention contains the second solvent having a predetermined viscosity and the third solvent having a function to decrease the viscosity of the second solvent. Until the third solvent evaporates, the viscosity of the second solvent is kept to be lower than the predetermined viscosity due to the presence of the third solvent, thus the ink keeps a low viscosity. After the third solvent evaporates, the viscosity of the second solvent returns to the predetermined viscosity and the ink becomes higher in viscosity. Accordingly, for example, it is possible to keep the low viscosity and an excellent ejectability of the ink until the ink is ejected from the ink jet apparatus, by suppressing the evaporation of the third solvent therefrom, and increase the viscosity and improve the flatness of the ink by causing the third solvent to evaporate after the ink is ejected from the ink jet apparatus.

BRIEF DESCRIPTION OF THE DRAWINGS

FIGS. 9A through 9C illustrate the viscosity of a solvent having the diester backbone;

FIG. 11 illustrates influences of the boiling point of the solvent on the ejectability and flatness.

FIG. 12 illustrates preferable conditions for ink composition;

FIGS. 16A-16G are process charts illustrating the manufacturing method of the organic electroluminescent device in one embodiment of the present invention;

FIGS. 17A-17E are process charts illustrating the manufacturing method of the organic electroluminescent device in one embodiment of the present invention;

FIGS. 20A and 20B show the organic electroluminescent apparatus in one embodiment of the present invention.

Figure 1:
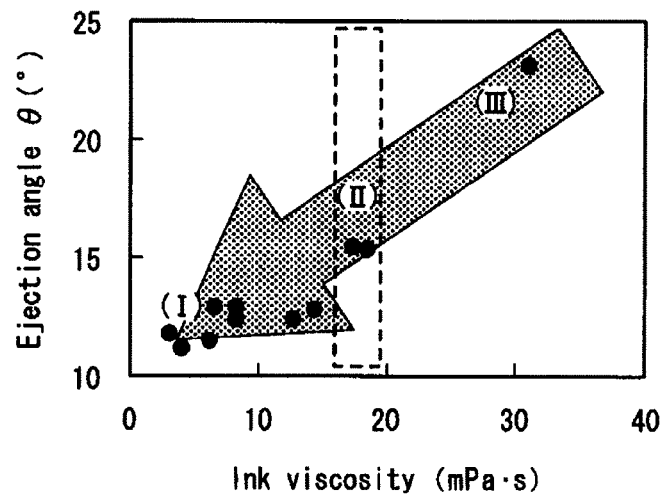
FIG. 1 shows the relationships between the ink viscosity and the ejection angle θ.

DESCRIPTION OF THE PREFERRED
EMBODIMENT(S)

The following describes an ink for an organic electroluminescent device, a manufacturing method of an organic electroluminescent device, an organic display panel, an organic display apparatus, an organic electroluminescent apparatus, an ink, a forming method of a functional layer, and an organic electroluminescent device in one embodiment of the present invention, with reference to the attached drawings.

An ink for an organic electroluminescent device in one embodiment of the present invention comprises: a functional material for constituting a functional layer of the organic electroluminescent device; a first solvent dissolving the functional material; a second solvent which has a diester backbone and is equal to or lower than the first solvent in boiling point, or higher than the first solvent in boiling point by a difference of 20° C. or less; and a third solvent which is an aliphatic alcohol and is lower than the first solvent and the second solvent in boiling point.

In one aspect of the ink for an organic electroluminescent device in one embodiment of the present invention, the ink transits, in accordance with atmospheric environment, from a first state in which the first, second and third solvents are contained therein, to a second state in which the first and second solvents are contained therein after the third solvent evaporates, and then to a third state in which only the first solvent is contained therein after the second solvent evaporates.

In one aspect of the ink for an organic electroluminescent device in one embodiment of the present invention, viscosity thereof in a state where the first, second, and third solvents are contained therein is in a range from 3 mPa·s to 20 mPa·s inclusive.

In one aspect of the ink for an organic electroluminescent device in one embodiment of the present invention, viscosity thereof in a state where the first, second, and third solvents are contained therein is in a range from 3 mPa·s to 13 mPa·s inclusive.

In one aspect of the ink for an organic electroluminescent device in one embodiment of the present invention, viscosity thereof in a state where the first and second solvents are contained therein after the third solvent evaporates is in a range from 20 mPa·s to 200 mPa·s inclusive.

In one aspect of the ink for an organic electroluminescent device in one embodiment of the present invention, viscosity thereof in a state where the first and second solvents are contained therein after the third solvent evaporates is in a range from 30 mPa·s to 200 mPa·s inclusive.

In one aspect of the ink for an organic electroluminescent device in one embodiment of the present invention, a mixture ratio of the second solvent to a sum of the second solvent and the third solvent is in a range from 30 molecular percent to 70 molecular percent, inclusive. The term "molecular percent" may be denoted as "mol %" herein.

In one aspect of the ink for an organic electroluminescent device in one embodiment of the present invention, a mixture ratio of a sum of the second solvent and the third solvent to a sum of the first solvent, the second solvent, and the third solvent is in a range from 3 mol % to 20 mol % inclusive.

In one aspect of the ink for an organic electroluminescent device in one embodiment of the present invention, the first solvent is phenoxy toluene, the second solvent is dimethyl phthalate, the third solvent is 1-nonanole, and the functional material is F8-F6.

In one aspect of the ink for an organic electroluminescent device in one embodiment of the present invention, boiling point of the first solvent is in a range from 260° C. to 350° C., boiling point of the second solvent is in a range from 280° C. to 350° C., and boiling point of the third solvent is in a range from 80° C. to 250° C.

An ink for an organic electroluminescent device in one embodiment of the present invention comprises: a functional material for constituting a functional layer of the organic electroluminescent device; a first solvent dissolving the functional material; a second solvent which is equal to or lower than the first solvent in boiling point, or higher than the first solvent in boiling point by a difference of 20° C. or less, and is higher than the first solvent in viscosity; and a third solvent which is lower than the first solvent and the second solvent in boiling point, and has a function to dissociate a part of chemical bonds between molecules constituting the second solvent to decrease viscosity of the second solvent.

In one aspect of the ink for an organic electroluminescent device in one embodiment of the present invention, a part of molecules constituting the second solvent can be hydrogen-bonded, and the second solvent is in a state where viscosity thereof has been decreased since the part of molecules constituting the second solvent has been hydrogen-bonded to molecules of the third solvent and hydrogen bonds of the second solvent have been dissociated, wherein the molecules of the third solvent are hydrogen-bonded to, in priority to others, the part of molecules constituting the second solvent.

In one aspect of the ink for an organic electroluminescent device in one embodiment of the present invention, the second solvent has a diester backbone, and the third solvent third is an aliphatic alcohol.

In one aspect of the ink for an organic electroluminescent device in one embodiment of the present invention, the ink transits, in accordance with atmospheric environment, from a first state in which the first, second and third solvents are contained therein, to a second state in which the first and second solvents are contained therein after the third solvent evaporates, and then to a third state in which only the first solvent is contained therein after the second solvent evaporates.

In one aspect of the ink for an organic electroluminescent device in one embodiment of the present invention, viscosity thereof in a state where the first, second, and third solvents are contained therein is in a range from 3 mPa·s to 20 mPa·s inclusive.

In one aspect of the ink for an organic electroluminescent device in one embodiment of the present invention, viscosity thereof in a state where the first, second, and third solvents are contained therein is in a range from 3 mPa·s to 13 mPa·s inclusive.

In one aspect of the ink for an organic electroluminescent device in one embodiment of the present invention, viscosity thereof in a state where the first and second solvents are contained therein after the third solvent evaporates is in a range from 20 mPa·s to 200 mPa·s inclusive.

In one aspect of the ink for an organic electroluminescent device in one embodiment of the present invention, viscosity thereof in a state where the first and second solvents are contained therein after the third solvent evaporates is in a range from 30 mPa·s to 200 mPa·s inclusive.

In one aspect of the ink for an organic electroluminescent device in one embodiment of the present invention, a mixture ratio of the second solvent to a sum of the second solvent and the third solvent is in a range from 30 mol % to 70 mol % inclusive.

In one aspect of the ink for an organic electroluminescent device in one embodiment of the present invention, a mixture ratio of a sum of the second solvent and the third solvent to a sum of the first solvent, the second solvent, and the third solvent is in a range from 3 mol % to 20 mol % inclusive.

In one aspect of the ink for an organic electroluminescent device in one embodiment of the present invention, the first solvent is phenoxy toluene, the second solvent is dimethyl phthalate, the third solvent is 1-nonanole, and the functional material is F8-F6.

In one aspect of the ink for an organic electroluminescent device in one embodiment of the present invention, boiling point of the first solvent is in a range from 260° C. to 350° C., boiling point of the second solvent is in a range from 280° C. to 350° C., and boiling point of the third solvent is in a range from 80° C. to 250° C.

In one aspect of the ink for an organic electroluminescent device in one embodiment of the present invention, concentration of the functional material is 0.1 weight percent or more and less than 4 weight percent. The term "weight percent" may be denoted as "wt %" herein.

A manufacturing method of an organic electroluminescent device in one embodiment of the present invention comprises: a first step for preparing an ink for forming a functional layer of the organic electroluminescent device and filling the ink into an ink jet apparatus having an ink ejection nozzle, wherein the ink is a mixture of a functional material for constituting the functional layer, a first solvent dissolving the functional material, a second solvent which has a diester backbone and is equal to or lower than the first solvent in boiling point, or higher than the first solvent in boiling point by a difference of 20° C. or less, and a third solvent which is an aliphatic alcohol and is lower than the first solvent and the second solvent in boiling point; a second step for preparing a substrate having a ground layer including a first electrode; a third step for causing the ink jet apparatus to eject droplets of the ink onto the ground layer; a fourth step for forming an ink droplet film by applying the droplets of the ink ejected in the third step onto the ground layer; a fifth step for forming a functional layer including an organic electroluminescent layer by drying the ink droplet film; and a sixth step for forming a second electrode above the functional layer, the second electrode having a different polarity from the first electrode.

A manufacturing method of an organic electroluminescent device in one embodiment of the present invention comprises: a first step for preparing an ink for forming a functional layer of the organic electroluminescent device and filling the ink into an ink jet apparatus having an ink ejection nozzle, wherein the ink is a mixture of a functional material for constituting the functional layer, a first solvent dissolving the functional material, a second solvent which has a diester backbone and is equal to or lower than the first solvent in boiling point, or higher than the first solvent in boiling point by a difference of 20° C. or less, and a third solvent which is lower than the first solvent and the second solvent in boiling point, and has a function to dissociate a part of chemical bonds between molecules constituting the second solvent to decrease viscosity of the second solvent; a second step for preparing a substrate having a ground layer including a first electrode; a third step for causing the ink jet apparatus to eject droplets of the ink onto the ground layer; a fourth step for forming an ink droplet film by applying the droplets of the ink ejected in the third step onto the ground layer; a fifth step for forming a functional layer including an organic electroluminescent layer by drying the ink droplet film; and a sixth step for forming a second electrode above the functional layer, the second electrode having a different polarity from the first electrode.

In one aspect of the manufacturing method of an organic electroluminescent device in one embodiment of the present invention, the third step causes the third solvent to evaporate from the ejected ink droplets so that viscosity of the ink becomes higher than in the first step.

In one aspect of the manufacturing method of an organic electroluminescent device in one embodiment of the present invention, the fourth step causes the third solvent to evaporate from the applied ink droplets so that viscosity of the ink becomes higher than in the first step.

In one aspect of the manufacturing method of an organic electroluminescent device in one embodiment of the present invention, the fourth step causes the second solvent, following the third solvent, to evaporate from the applied ink droplets so that viscosity of the ink becomes further higher than in the first step.

In one aspect of the manufacturing method of an organic electroluminescent device in one embodiment of the present invention, the fifth step causes the third solvent to evaporate from the ink droplet film by drying the ink droplet film so that viscosity of the ink becomes higher than in the first step.

In one aspect of the manufacturing method of an organic electroluminescent device in one embodiment of the present invention, the fifth step causes the second solvent and the first solvent to evaporate in this order following the third solvent from the ink droplet film by drying the ink droplet film so that viscosity of the ink becomes further higher than in the first step.

An organic display panel in one embodiment of the present invention uses the organic electroluminescent device manufactured by any of the above-described manufacturing methods of an organic electroluminescent device.

An organic display apparatus in one embodiment of the present invention uses the organic electroluminescent device manufactured by any of the above-described manufacturing methods of an organic electroluminescent device.

An organic electroluminescent apparatus in one embodiment of the present invention uses the organic electroluminescent device manufactured by any of the above-described manufacturing methods of an organic electroluminescent device.

An ink in one embodiment of the present invention comprises: a functional material; a first solvent dissolving the functional material; a second solvent which has a diester backbone and is equal to or lower than the first solvent in boiling point, or higher than the first solvent in boiling point by a difference of 20° C. or less; and a third solvent which is an aliphatic alcohol and is lower than the first solvent and the second solvent in boiling point.

An ink in one embodiment of the present invention comprises: a functional material; a first solvent dissolving the functional material; a second solvent which is equal to or lower than the first solvent in boiling point, or higher than the first solvent in boiling point by a difference of 20° C. or less, and is higher than the first solvent in viscosity; and a third solvent which is lower than the first solvent and the second solvent in boiling point, and has a function to dissociate a part of chemical bonds between molecules constituting the second solvent to decrease viscosity of the second solvent.

In one aspect of the ink in one embodiment of the present invention, the viscosity is in a range from 3 mPa·s to 20 mPa·s inclusive before the third solvent evaporates, and the viscosity is in a range from 30 mPa·s to 200 mPa·s inclusive after the third solvent evaporates.

In one aspect of the ink in one embodiment of the present invention, a mixture ratio of a sum of the second solvent and the third solvent to a sum of the first solvent, the second solvent, and the third solvent is in a range from 3 mol % to 20 mol % inclusive.

In one aspect of the ink in one embodiment of the present invention, concentration of the functional material is 0.1 wt % or more and less than 4 wt %.

A forming method of a functional layer in one embodiment of the present invention comprises: a first step for preparing an ink for forming the functional layer and filling the ink into an ink jet apparatus having an ink ejection nozzle, wherein the ink is a mixture of a functional material for constituting the functional layer, a first solvent dissolving the functional material, a second solvent which has a diester backbone and is equal to or lower than the first solvent in boiling point, or higher than the first solvent in boiling point by a difference of 20° C. or less, and a third solvent which is an aliphatic alcohol and is lower than the first solvent and the second solvent in boiling point; a second step for preparing a substrate for forming the functional layer; a third step for causing the ink jet apparatus to eject droplets of the ink onto the substrate; a fourth step for forming an ink droplet film by applying the droplets of the ink ejected in the third step onto the substrate; and a fifth step for forming the functional layer by drying the ink droplet film.

A forming method of a functional layer in one embodiment of the present invention comprises: a first step for preparing an ink for forming the functional layer and filling the ink into an ink jet apparatus having an ink ejection nozzle, wherein the ink is a mixture of a functional material for constituting the functional layer, a first solvent dissolving the functional material, a second solvent which has a diester backbone and is equal to or lower than the first solvent in boiling point, or higher than the first solvent in boiling point by a difference of 20° C. or less, and a third solvent which is lower than the first solvent and the second solvent in boiling point, and has a function to dissociate a part of chemical bonds between molecules constituting the second solvent to decrease viscosity of the second solvent; a second step for preparing a substrate for forming the functional layer; a third step for causing the ink jet apparatus to eject droplets of the ink onto the substrate; a fourth step for forming an ink droplet film by applying the droplets of the ink ejected in the third step onto the substrate; and a fifth step for forming the functional layer by drying the ink droplet film.

In one aspect of the forming method of a functional layer in one embodiment of the present invention, the third step causes the third solvent to evaporate from the ejected ink droplets so that viscosity of the ink becomes higher than in the first step.

In one aspect of the forming method of a functional layer in one embodiment of the present invention, the fourth step causes the third solvent to evaporate from the applied ink droplets so that viscosity of the ink becomes higher than in the first step.

In one aspect of the forming method of a functional layer in one embodiment of the present invention, the fourth step causes the second solvent, following the third solvent, to evaporate from the applied ink droplets so that viscosity of the ink becomes further higher than in the first step.

In one aspect of the forming method of a functional layer in one embodiment of the present invention, the fifth step causes the third solvent to evaporate from the ink droplet film by drying the ink droplet film so that viscosity of the ink becomes higher than in the first step.

In one aspect of the forming method of a functional layer in one embodiment of the present invention, the fifth step causes the second solvent and the first solvent to evaporate in this order following the third solvent from the ink droplet film by drying the ink droplet film so that viscosity of the ink becomes further higher than in the first step.

An organic electroluminescent device in one embodiment of the present invention comprises: the functional layer formed by any of the above-described forming methods of a functional layer.

An organic display panel in one embodiment of the present invention uses the above-described organic electroluminescent device.

An organic display apparatus in one embodiment of the present invention uses the above-described organic electroluminescent device.

An organic electroluminescent apparatus in one embodiment of the present invention uses the above-described organic electroluminescent device.

The following describes how the ink, excellent in both the ejectability and the flatness, was developed.

The inventors of the present invention first researched how the viscosity of the ink influences the ejectability of the ink.

FIG. 1 shows the relationships between the ink viscosity and the ejection angle θ. In FIG. 1, an area (II) enclosed by a dotted line is an area of conventional ink viscosities; an area (I), shown on the left-hand side of the area (II), is an area of ink viscosities lower than the conventional ink viscosities; and an area (III), shown on the right-hand side of the area (II), is an area of ink viscosities higher than the conventional ink viscosities. As shown in FIG. 1, a tendency observed in these inks is that the higher the viscosity is, the larger the ejection angle θ is (the lower the landing accuracy is). That is to say, the higher the ink viscosity is, the lower the ejectability is. Note that the ejection angle θ was evaluated by the standard deviation 6σ.

Figure 2A:
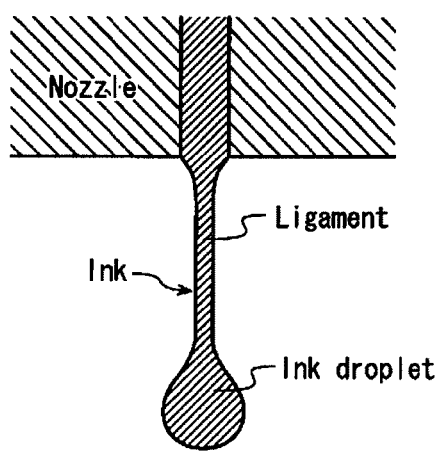
FIGS. 2A and 2B illustrate the influence of the ink viscosity on the ejection angle θ.
Figure 2B:
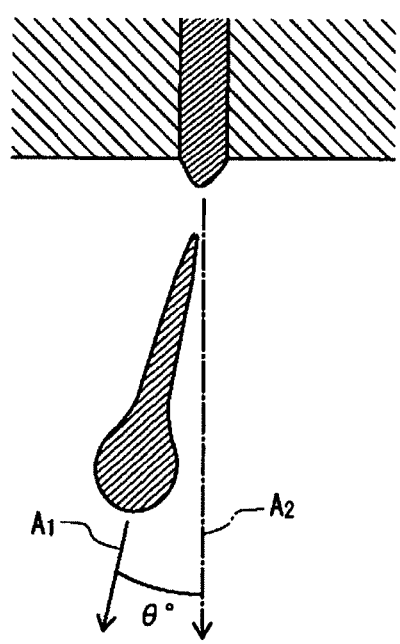

FIGS. 2A and 2B illustrate the influence of the ink viscosity on the ejection angle θ. In FIGS. 2A and 2B, the solid line arrow $A_1$ indicates an actual ejection direction, the chained line arrow $A_2$ indicates an ideal ejection direction, and θ indicates an ejection angle that is an angle between these directions. The higher the ink viscosity is, the larger the ejection angle θ is. This is considered to be because the higher the viscosity is, the longer the ligament of the ink droplet is. That is to say, as shown in FIG. 2A, when the ligament is long, the ejection is apt to be deviated from the ideal direction by the reaction that occurs when the ink droplet leaves the nozzle of the ink jet apparatus, causing the ejection angle θ to be large as shown in FIG. 2B. Also, when the ligament is long, the ink droplet is apt to be influenced by air current, and in that case as well, the ejection angle θ is apt to be large.

Next, the inventors of the present invention researched how the viscosity of the ink influences the flatness of the ink.

Figure 3:
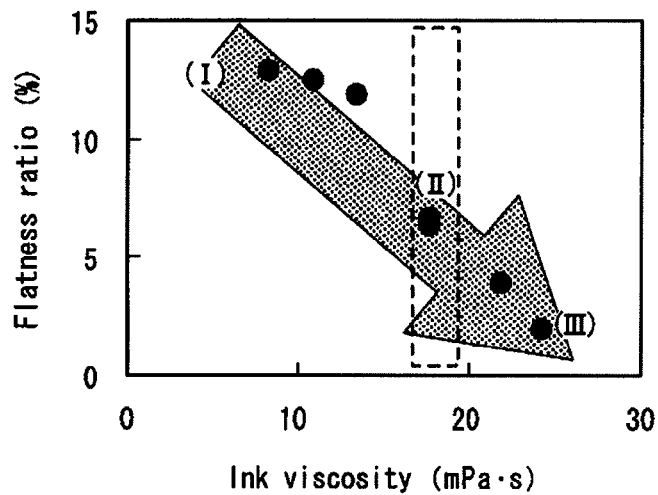
FIG. 3 shows the relationships between the ink viscosity and the flatness ratio of the upper surface of the functional layer.

FIG. 3 shows the relationships between the ink viscosity and the flatness ratio of the upper surface of the functional layer. In FIG. 3, an area (II) enclosed by a dotted line is an area of conventional ink viscosities; an area (I), shown on the left-hand side of the area (II), is an area of ink viscosities lower than the conventional ink viscosities; and an area (III), shown on the right-hand side of the area (II), is an area of ink viscosities higher than the conventional ink viscosities. As shown in FIG. 3, it was observed that the higher the ink viscosity is, the lower the flatness ratio of the upper surface of the functional layer is.

Figure 4:
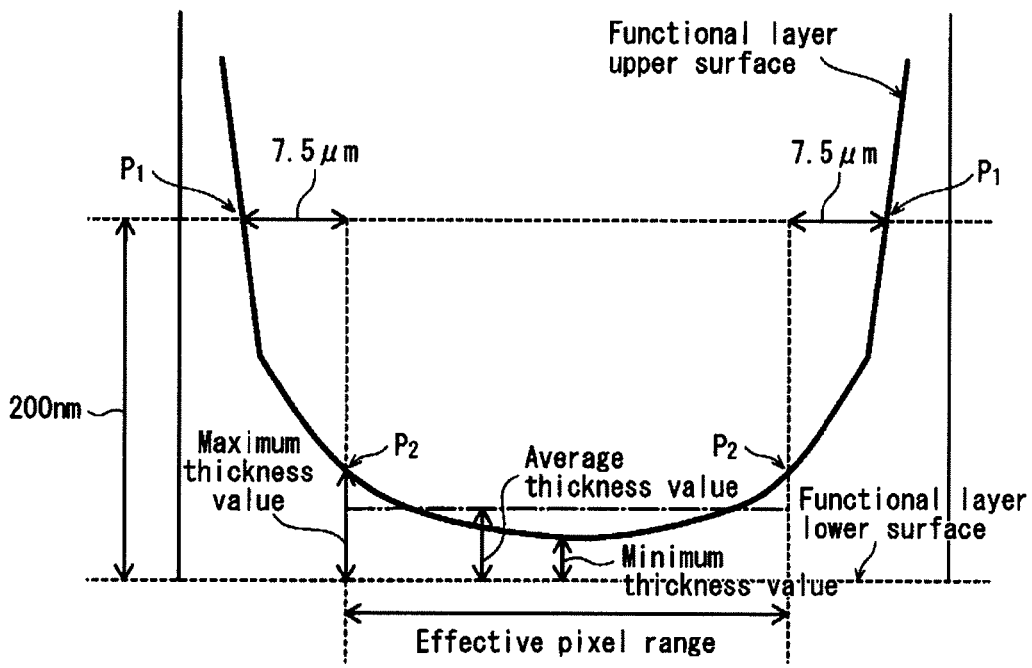
FIG. 4 illustrates how to calculate the flatness ratio.

FIG. 4 illustrates how to calculate the flatness ratio. As shown in FIG. 4, the flatness ratio is calculated as follows: first, the thickness distribution of the functional layer is measured with use of an Atomic Force Microscope (AFM); then the maximum thickness value, the minimum thickness value, and the average thickness value in an effective pixel range of the functional layer are obtained from the measurement result; and the obtained values are substituted into the following equation (Equation 1).

$$\text{Flatness ratio} = (\text{maximum thickness value} - \text{minimum thickness value}) \div 2 \div \text{average thickness value} \times 100 \quad \text{(Equation 1)}$$

Note that the effective pixel range is a range to which a voltage is applied when the organic electroluminescent device is driven, and which is located between two positions $P_2$ each of which is 7.5 µm away from a position $P_1$ toward the center of the pixel, wherein the thickness of the functional layer is 200 nm at positions $P_1$.

Figure 5:
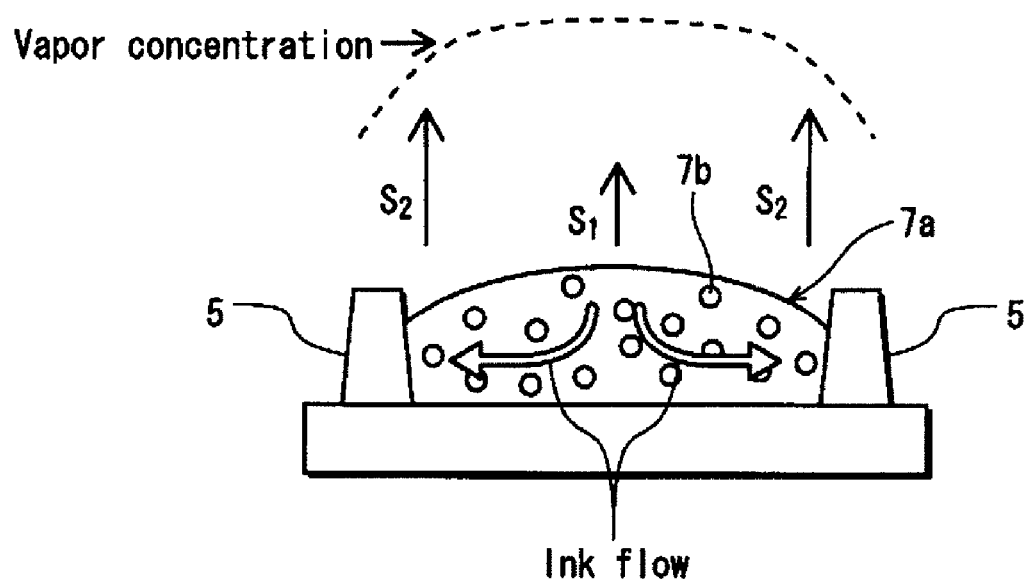
FIG. 5 illustrates the influence of the ink viscosity on the flatness ratio.

FIG. 5 illustrates the influence of the ink viscosity on the flatness ratio. As shown in FIG. 5, the concentration of solvent vapor is higher in the space above the pixel central area than in spaces above areas near the banks. This is because the pixel central area is sandwiched by the areas near the banks, and since the areas near the banks also generate the solvent vapor, the solvent vapor generated by the pixel central area is diffused only upward; on the other hand, banks 5 do not generate solvent vapor, thus the spaces above the banks 5 are low in solvent vapor pressure, and the solvent vapor generated by the areas near the banks are diffused not only upward but also toward the banks 5.

In the space above the pixel central area having a high vapor concentration, the evaporation speed is low as indicated by the arrow $S_1$, and in the spaces near the banks having a low vapor concentration, the evaporation speed is high as indicated by the arrows $S_2$. When there is a difference in evaporation speed, a flow of ink 7a from the pixel central area, having low evaporation speed, to the areas near the banks, having high evaporation speed, is generated, and in the areas near the banks to which the ink 7a flows, only the solvent evaporates from the ink 7a and a functional material 7b is heaped.

The lower the viscosity of the ink 7a is, the easier to flow the ink 7a is. Accordingly, in the areas near the banks, a larger amount of functional material 7b is heaped and the thickness is larger that much. On the other hand, the higher the viscosity of the ink 7a is, the stronger the braking force against the flow of the ink 7a is. In that case, the layer thickness is considered to be smaller and the flatness lower.

Figure 6:
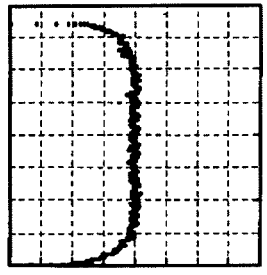
FIG. 6 illustrates influences of ink viscosity on the ejectability and flatness.

FIG. 6 illustrates influences of ink viscosity on the ejectability and flatness. The relationships between the ink viscosity and ejectability and the relationships between the ink viscosity and flatness were researched and the results are shown in FIG. 6. As shown in FIG. 6, with the conventional ink viscosity, the ejectability is good (represented by the circle sign) but the flatness is not satisfactory (represented by the triangle sign); with ink viscosity which is lower than the conventional ink viscosity, the ejectability is very good (represented by the double circle sign) but the flatness is poor (represented by the cross sign); and with ink viscosity which is higher than the conventional ink viscosity, the flatness is good but the ejectability is poor. In this way, it had been difficult to obtain an ink which is excellent in both the ejectability and the flatness no matter how the ink viscosity had been varied. Note that, as will be described later, the ink of the present embodiment is excellent in both the ejectability and the flatness (as represented by the circle sign in the drawing).

As described above, the ejectability and the flatness of the ink are conflicting properties, and to improve the ejectability of ink, the viscosity of the ink is preferably low, while to improve the flatness of ink, the viscosity of the ink is preferably high. In view of this, the inventors focused on the fact that generally the ink is required to have a good ejectability until the ink is ejected from the ink jet apparatus, but not after the ejection; and the ink is required to have a good flatness after the ink is ejected from the ink jet apparatus, but not before the ejection. As a result, the inventors came to a conclusion that an ink which is excellent in both the ejectability and the flatness can be realized with an ink whose viscosity changes over time, more specifically, with an ink whose viscosity is low until the ink is ejected, and high after the ink is ejected.

Figure 7:
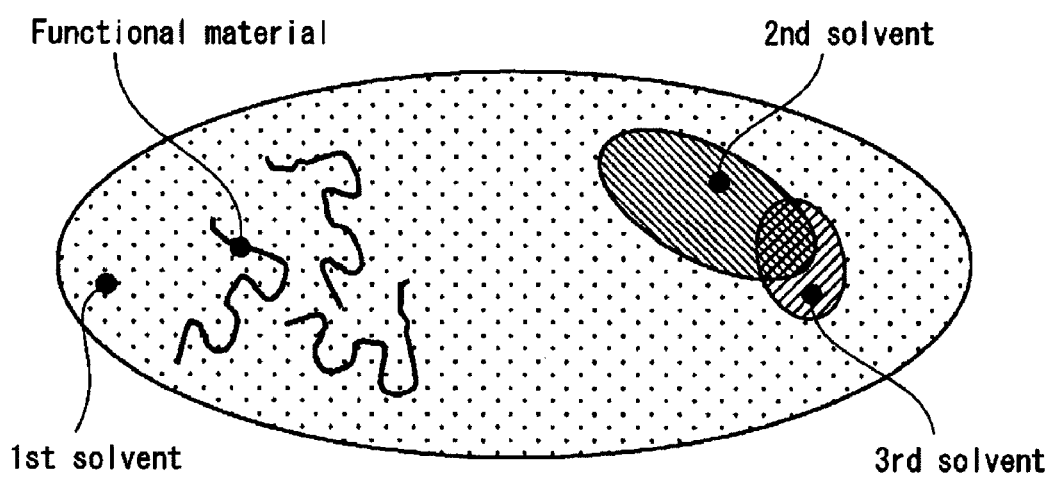
FIG. 7 is a conceptual diagram showing the composition of the ink in one embodiment of the present invention.

FIG. 7 is a conceptual diagram showing the composition of the ink in one embodiment of the present invention. As shown in FIG. 7, the ink in one embodiment of the present invention includes the functional material, the first solvent, the second solvent, and the third solvent. The first solvent is a solvent for dissolving the functional material, the second solvent is a solvent for increasing the viscosity of the ink, and the third solvent is a solvent for keeping the second solvent low in viscosity until the ink is ejected from the ink jet apparatus. With this structure, the ink is low in viscosity and excellent in ejectability until the ink is ejected, and is high in viscosity and excellent in flatness after the ink is ejected.

More specifically, in accordance with the atmospheric environment, the ink transits from the first state to the second state and to the third state. That is to say, the ink is in the first state of containing the first, second and third solvents, then the third solvent evaporates and the ink transits to the second state of containing only the first and second solvents, and then the second solvent evaporates and the ink transits to the third state of containing only the first solvent. More specifically, until the ink is ejected from the ink jet apparatus, the ink is in the first state containing the third solvent, and after the ink is ejected, the third solvent quickly evaporates and the ink transits to the second state. As the third solvent evaporates and the ink transits from the first state to the second state, the ink viscosity increases and the ink changes from a low viscosity to a high viscosity.

The following describes the reason why the viscosity changes as the third solvent evaporates.

Figure 8:
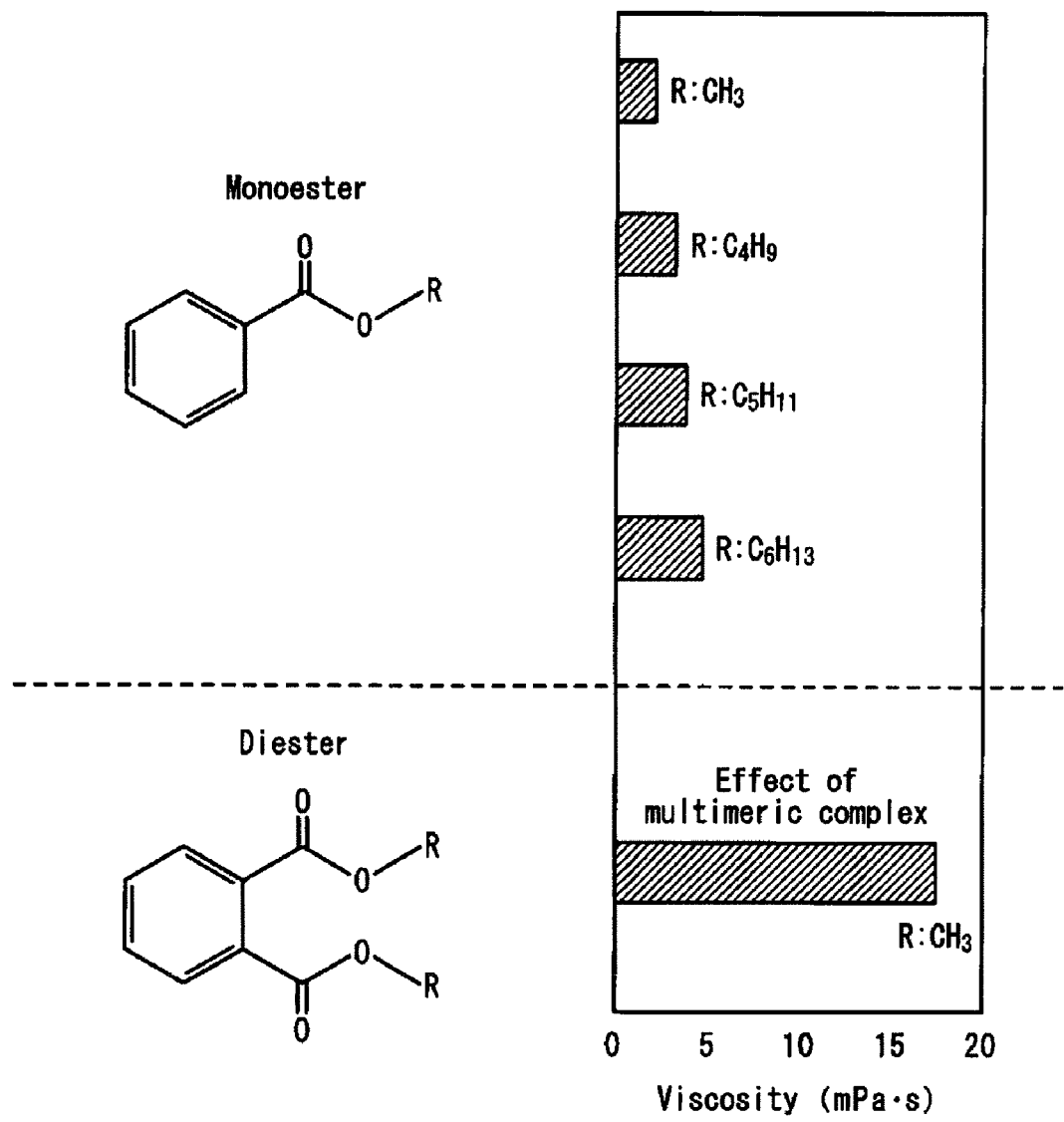
FIG. 8 illustrates the viscosity of the solvent.

FIG. 8 illustrates the viscosity of the solvent. As shown in FIG. 8, a solvent having the diester backbone is, due to the effect of the multimeric complex, far more viscous than a solvent having the monoester backbone. In this way, a solvent having the diester backbone is highly viscous and thus is preferable as the second solvent used for increasing the viscosity of the ink.

FIGS. 9A through 9C illustrate the viscosity of a solvent having the diester backbone. The reason why a solvent having the diester backbone is higher in viscosity than a solvent having the monoester backbone is as follows. That is to say, as shown in FIG. 9A, in a solvent having the monoester backbone, there is one ester bond per molecule, and even if a hydrogen bond occurs in the ester bond, merely a dimer is formed. In that case, the viscosity of the solvent does not increase so much.

On the other hand, as shown in FIG. 9B, in a solvent having the diester backbone, there are two ester bonds per molecule, and when hydrogen bonds occur in the ester bonds, a multimeric complex is formed. Thus the viscosity of the solvent increases due to the effect of the multimeric complex. In this way, a solvent having the diester backbone is highly viscous when it is alone. Accordingly, by adding a solvent which has the diester backbone and is highly effective in increasing the viscosity, the ink becomes highly viscous.

However, as shown in FIG. 9C, molecules of aliphatic alcohols are hydrogen-bonded to, in priority to the others, molecules of a solvent having the diester backbone. With this action, the hydrogen bonds between molecules of a solvent having the diester backbone are dissociated, the multimeric complexes become monomers, and the solvent having the diester backbone becomes low in viscosity. Two molecules of an aliphatic alcohol are hydrogen-bonded to one molecule of a solvent having the diester backbone. Accordingly, in theory, when there are an aliphatic alcohol and a solvent having the diester backbone at a rate of 2 or more to 1 (mol), all hydrogen bonds between molecules of the solvent having the diester backbone are dissociated, and the viscosity of the solvent having the diester backbone becomes the lowest.

In this way, an aliphatic alcohol is preferable as the third solvent since it has a function to dissociate the hydrogen bond between molecules of a solvent having the diester backbone. Furthermore, when only the aliphatic alcohol is caused to evaporate from the mixed solvent of the solvent having the diester backbone and the aliphatic alcohol, hydrogen bonds occur among the molecules of the solvent having the diester backbone, and thus the solvent having the diester backbone becomes highly viscous again.

As described above, when the solvent having the diester backbone is mixed with the aliphatic alcohol, the viscosity of the solvent having the diester backbone itself becomes low. This is an act/effect totally different from the reduction of viscosity achieved merely by diluting a high-viscosity solvent with a low-viscosity solvent. This will be explained in the following.

Figure 10:
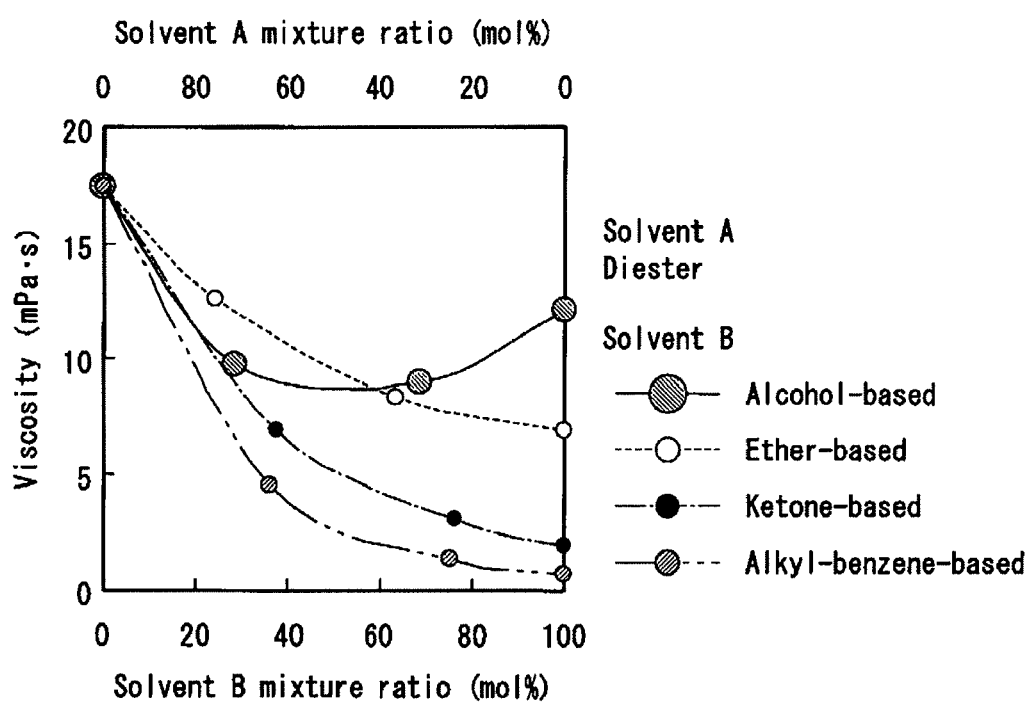
FIG. 10 illustrates the influence of the mixture ratio of solvent on the viscosity.

FIG. 10 illustrates the influence of the mixture ratio of solvent on the viscosity. In FIG. 10, solvent A is a solvent having the diester backbone, and solvent B is a solvent whose viscosity is lower than the solvent having the diester backbone. Various mixed solutions of solvent A and solvent B were generated, viscosities thereof were measured, and the viscosity gradients thereof were confirmed. As a result, it was found that mixed solutions in which alcohol-based solvents were used as solvent B are different in viscosity gradient from mixed solutions in which solvents other than alcohol-based solvents (an ether-based solvent, a ketone-based solvent, and an alkyl-benzene-based solvent) were used as solvent B.

It should be noted here that, with regard to the solvents other than the alcohol-based solvents, when the mixture ratio of solvent A is 100 mol %, the viscosity of the mixed solvent is the viscosity of the solvent A itself; and when the mixture ratio of solvent A is 0 mol %, the viscosity of the mixed solvent is the viscosity of the solvent B itself. Also, when the mixture ratio of solvent A is more than 0 mol % and less than 100 mol %, the viscosity of the mixed solvent is an intermediate viscosity between solvent A and solvent B, and the less the mixture ratio of solvent A is, the less the viscosity of the mixed solvent is. This is because when solvent A and solvent B are mixed, solvent A is merely diluted and the viscosity of the mixed solvent is decreased.

On the other hand, with regard to the alcohol-based solvents, when the mixture ratio of solvent A is 100 mol %, the viscosity of the mixed solvent is the viscosity of the solvent A itself and when the mixture ratio of solvent A is 0 mol %, the viscosity of the mixed solvent is the viscosity of the solvent B itself In this respect, the alcohol-based solvents are equivalent with the solvents other than the alcohol-based solvents. However, when the mixture ratio of solvent A is more than 0 mol % and less than 100 mol %, the viscosity of the mixed solvent is not necessarily an intermediate viscosity between solvent A and solvent B. With regard to mixture ratios in a specific range, the viscosity of the mixed solvent is lower than the viscosity of the solvent B itself That is to say, a trend in which the following two phenomena occur was observed once a specific mixture ratio is exceeded: a phenomenon in which the viscosity of the mixed solvent decreases as the mixture ratio of solvent A decreases; and a phenomenon in which the viscosity of the mixed solvent increases as the mixture ratio of solvent A decreases. The trend is observed because, as described earlier, not only the solvent A is diluted but the viscosity of solvent A itself is decreased, as the solvent B dissociates the hydrogen bonds between molecules of solvent A.

As described above, the third solvent is a solvent that has an act/effect to decrease the viscosity of the second solvent. When the second solvent is mixed with the third solvent, a part of chemical bonds between molecules of the second solvent is dissociated and the viscosity of the second solvent is decreased.

Next, the boiling point of the solvent will be explained. To make the ink highly viscous after it is ejected from the ink jet apparatus, the third solvent needs to be caused to evaporate before the second solvent evaporates. Also, when the first solvent evaporates before the second solvent evaporates, there is a possibility that the functional material having been dissolved in the first solvent may be deposited. Thus the second solvent needs to be caused to evaporate before the first solvent evaporates. Therefore the boiling points of the first through third solvents are preferably set so that only the third solvent evaporates first, then only the second solvent evaporates, and lastly the first solvent evaporates. That is to say, it is preferable that the relationship among the boiling points of the first through third solvents is represented as: the first solvent>the second solvent>the third solvent.

FIG. 11 illustrates influences of the boiling point of the solvent on the ejectability and flatness. It should be noted here that, although a preferable relationship among the boiling points of the first through third solvents is "the first solvent>the second solvent>the third solvent", the present invention is not limited to this relationship. As shown in FIG. 11, an excellent flatness was obtained when the relationship among the boiling points of the first through third solvents is represented as: the first solvent≈the second solvent>the third solvent (FIG. 11 shows, as a specific example of "the first solvent≈the second solvent", data of the case where the second solvent is higher than the first solvent by 20° C. in boiling point).

On the other hand, a deposition of the functional material was observed before the ink was dried up when the relationship among the boiling points of the first through third solvents is: the second solvent>the first solvent>the third solvent (FIG. 11 shows, as a specific example of "the second solvent>the first solvent", data of the case where the second solvent is higher than the first solvent by 50° C. in boiling point). As a result of this, although a large difference in thickness was not observed between the pixel central area and the areas near the banks in the upper surface of the functional layer, the upper surface of the functional layer was not flat entirely. This is considered to be because, even if the second solvent is higher than the first solvent in boiling point, when the difference from the first solvent in boiling point is 20° C. or less, the first solvent and the second solvent can evaporate at the same time by azeotropy, making it difficult for the functional material to be deposited; on the other hand, when the second solvent is higher than the first solvent in boiling point and the difference from the first solvent in boiling point is 50° C. or greater, an excessive amount of the first solvent evaporates first and thus the functional material is deposited. It is considered that this phenomenon occurs when the functional material is unnecessary for the second solvent.

Also, when the relationship among the boiling points of the first through third solvents is represented as: the first solvent>the second solvent≈the third solvent, the second solvent evaporates together with the third solvent, and thus the effect of increasing the viscosity by the second solvent could not be obtained sufficiently, and an excellent flatness was not obtained.

The above description suggests that, unless the relationship among the boiling points of the first through third solvents is appropriate, it is impossible to obtain such ink that is excellent in both the ejectability and the flatness. A preferable relationship among the boiling points of the first through third solvents includes: the second solvent is lower than or equal to the first solvent in boiling point; and the second solvent is higher than the first solvent by 20° C. or less in boiling point. It is also preferable that the third solvent is lower than the first solvent and the second solvent in boiling point.

FIG. 12 illustrates preferable conditions for ink composition. As shown in FIG. 12, the preferable ranges of boiling point for the first, second, and third solvents are: 260-350° C.; 280-350° C.; and 80-250° C., respectively. With such relationship among the boiling points of the first through third solvents, it is possible to obtain an ink that is appropriately volatile, excellent in film formation, and suitable for the ink jet method. Note that the difference in boiling point between the second solvent and the third solvent is preferably in a range from 80° C. to 180° C. When the difference in boiling point between the second solvent and the third solvent is in this range, it is possible to increase the ink viscosity rapidly after the ink is ejected from the ink jet apparatus, and form a flatter functional layer.

Next, the viscosity of the solvent will be explained. As shown in FIG. 12, the viscosity of each solvent alone is not specifically set, but the viscosity of the ink in the first state before the third solvent evaporates, namely the viscosity of the ink containing the first, second, and third solvents is preferably in the range from 3 mPa·s to 20 mPa·s, and is more preferably in the range from 3 mPa·s to 13 mPa·s. This makes it possible to obtain a preferable ejectability suitable for the ink jet method. Also, the viscosity of the ink in the second state after the third solvent evaporates, namely the viscosity of the ink containing the first and second solvents is preferably in the range from 20 mPa·s to 200 mPa·s, and is more preferably in the range from 30 mPa·s to 200 mPa·s. This makes it possible to obtain a preferable flatness.

The concentration of the functional material in the ink is preferably in the range from 0.1 wt % to less than 4 wt %.

Figure 13:
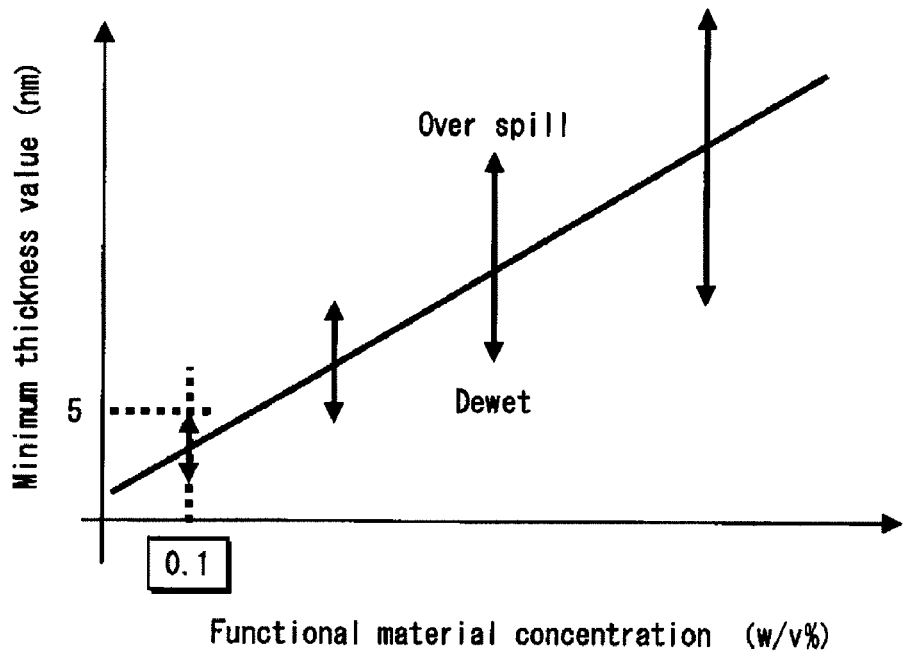
FIG. 13 illustrates the relationships between the concentration of the functional material and the thickness of the functional layer.

FIG. 13 illustrates the relationships between the concentration of the functional material and the thickness of the functional layer. Note that in FIG. 13, the term "over spill" means that the droplet flows over the banks, and the term "dewet" means that an unwet area is observed in the area encircled by the banks. The reason why the concentration of the functional material is preferably 0.1 wt % or more is that, as shown in FIG. 13, if the concentration of the functional material is less than 0.1 wt %, there is a fear that the minimum layer thickness of the functional layer may be less than 5 nm, which is the borderline of the practical use.

Figure 14:
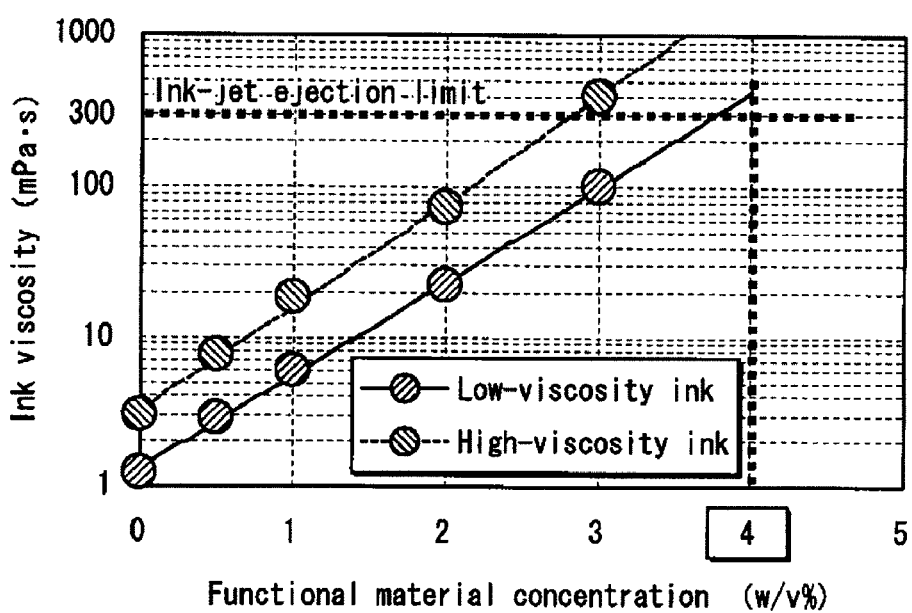
FIG. 14 illustrates the relationships between the concentration of the functional material and the ink viscosity.

FIG. 14 illustrates the relationships between the concentration of the functional material and the ink viscosity. The reason why the concentration of the functional material is preferably less than 4 wt % is that, as shown in FIG. 14, if the concentration of the functional material is 4 wt % or more, the ink viscosity reaches 300 mPa·s at which the nozzle of the ink jet apparatus is clogged with the ink.

[Ink for Organic Electroluminescent Device]

The ink in one embodiment of the present invention includes the functional material, first solvent, second solvent, and third solvent.

<Functional Material>

The functional material is, for example, a material constituting the light-emitting layer of the organic electroluminescent device. Specifically, the functional material is preferably F8-F6 (a copolymer of F8 (poly dioctylfluorene) and F6 (poly dihexylfluorene)). Other than F8-F6, the functional material may be, for example, any of the following: a fluorene compound such as F8 or F6 other than F8-F6; oxynoid compound; perylene compound; coumarin compound; azacoumarin compound; oxazole compound; oxadiazole compound; perinone compound; pyrrolopyrrole compound; naphthalene compound; anthracene compound; fluoranthene compound; tetracene compound; pyrene compound; coronene compound; quinolone compound and azaquinolone compound; pyrazoline derivative and pyrazolone derivative; rhodamine compound; chrysene compound; phenanthrene compound; cyclopentadiene compound; stilbene compound; diphenylquinone compound; styryl compound; butadiene compound; dicyanomethylenepyran compound; dicyanomethylenethiopyran compound; fluorescein compound; pyrylium compound; thiapyrylium compound; selenapyrylium compound; telluropyrylium compound; aromatic aldadiene compound; oligophenylene compound;

thioxanthene compound; anthracene compound; cyanine compound; acridine compound; metal complex containing 8-hydroxyquinoline compound; metal complex containing 2-bipyridine compound; group III metal complex containing a Schiff base; metal complex containing oxine; and rare earth metal complex (see Japanese Patent Application Publication No. H5-163488). These compounds and complexes may be used singly or in mixture with one another.

<First Solvent>

The first solvent is a solvent for dissolving the functional material, and is preferably phenoxy toluene. Other than phenoxy toluene, the first solvent may be, for example, any of the following: cyclohexylbenzene; diethylbenzene; decahydronaphthalene; methyl benzoate; acetophenone; phenylbenzene; benzyl alcohol; tetrahydronaphthalene; isophorone; n-dodecane; dicyclohexyl; and p-xylene glycol dimethyl ether. These solvents may be used singly or in mixture with one another.

<Second Solvent>

The second solvent is a solvent having an action of increasing the viscosity, and is preferably dimethyl phthalate. Other than dimethyl phthalate, the second solvent is preferably a solvent having a diether backbone, such as diether phthalate or dipropyl phthalate. Alternatively, the second solvent may be a solvent without a diether backbone. Note that, when a regioisomer may be present in a solvent having a diether backbone, the substituent may take any positional relationship among ortho, meta, and para.

The second solvent is preferably a solvent a part of whose constituent molecules can be chemical-bonded so that, when molecules constituting the third solvent are chemical-bonded to, in priority to the others, the part of molecules of the second solvent, the chemical bonds of the second solvent are dissociated, and the second solvent decreases in viscosity. In the case of a solvent having a diether backbone, a part of constituent molecules thereof can be hydrogen-bonded, and when the solvent is mixed with an alcohol-based solvent, molecules of the alcohol-based solvent are hydrogen-bonded to, in priority to the others, the part of molecules of the solvent having a diether backbone, and as a result, the hydrogen-bonds of the solvent having a diether backbone are dissociated, and the solvent having a diether backbone decreases in viscosity. It should be noted here that the chemical bond is not limited to the hydrogen bond.

<Third Solvent>

The third solvent is a solvent for keeping the second solvent low in viscosity, and is preferably 1-nonanole. Other than 1-nonanole, the third solvent is preferably an alcohol-based solvent which may be an aliphatic alcohol such as 2-ethylhexanol, decanol, 2-nonanole, or 2-methyl-2-nonanole, or an aromatic alcohol such as benzyl alcohol. Especially aliphatic alcohols are preferable since molecules thereof are not high in bulk and, due to this, are more apt to be hydrogen-bonded to, in priority to the others, molecules of the solvent having a diether backbone.

[Organic Electroluminescent Device and Organic Display Panel]

Figure 15:
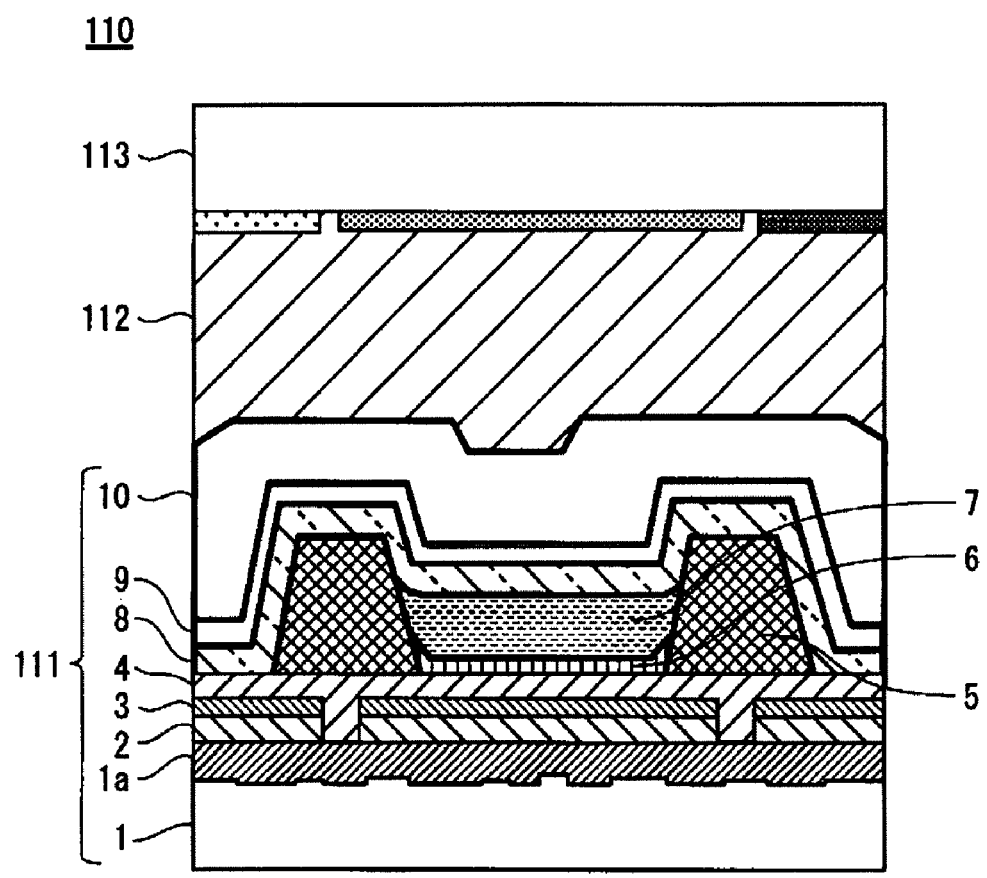
FIG. 15 illustrates how layers are stacked in the organic display panel in one embodiment of the present invention.

FIG. 15 illustrates how layers are stacked in the organic display panel in one embodiment of the present invention. As shown in FIG. 15, an organic display panel 110 in one embodiment of the present invention has a structure that is formed by bonding a color filter substrate 113 onto an organic electroluminescent device 111 in one embodiment of the present invention, via a sealing material 112.

The organic electroluminescent device 111 is a top-emission-type organic electroluminescent device in which the pixels for the colors R, G and B are arranged in a matrix or in lines, and each pixel has a layered structure composed of layers stacked on a TFT substrate 1.

On the TFT substrate 1, first anode electrodes 2 are formed in a matrix or in lines, and second anode electrodes 3 are formed thereon in a matrix or in lines. A hole injection layer 4 is stacked on the anode electrodes 2 and 3. On the hole injection layer 4, banks 5 are formed to define the pixels, and in each region defined by the banks 5, a hole transport layer 6 and an organic electroluminescent layer 7 are stacked in the stated order. Furthermore, an electron transport layer 8, a cathode electrode 9, and a sealing layer 10 are formed in the stated order on the organic electroluminescent layer 7 so that each of them extends over the banks 5 to be one layer.

Each region defined by the banks 5 has a multi-layer stack structure in which the hole injection layer 4, the hole transport layer 6, the organic electroluminescent layer 7, and the electron transport layer 8 are stacked in the stated order. The functional layer is structured from the stack structure composed of these layers. Note that the functional layer may include other layers such as an electron injection layer.

The representative structure of the functional layer includes the following device structures: (1) the hole injection layer/the organic electroluminescent layer; (2) the hole injection layer/the hole transport layer/the organic electroluminescent layer; (3) the hole injection layer/the organic electroluminescent layer/the electron injection layer; (4) the hole injection layer/the hole transport layer/the organic electroluminescent layer/the electron injection layer; (5) the hole injection layer/the organic electroluminescent layer/the hole block layer/the electron injection layer; (6) the hole injection layer/the hole transport layer/the organic electroluminescent layer/the hole block layer/the electron injection layer; (7) the organic electroluminescent layer/the hole block layer/the electron injection layer; and (8) the organic electroluminescent layer/the electron injection layer.

The TFT substrate 1 is composed of a base substrate and an amorphous TFT (EL device drive circuit) formed on the base substrate, wherein the base substrate is made of an insulation material such as alkali-free glass, soda glass, non-luminescent glass, phosphoric-acid-containing glass, boric-acid-containing glass, quartz, acrylic-type resin, styrene-type resin, polycarbonate-type resin, epoxy-type resin, polyethylene, polyester, silicone-type resin, or alumina.

The first anode electrode 2 is made of, for example, Ag (silver), APC (alloy of silver, palladium, and copper), ARA (alloy of silver, rubidium, and gold), MoCr (alloy of molybdenum and chrome), or NiCr (alloy of nickel and chrome). In the case of a top-emission-type organic electroluminescent device, the first anode electrodes 2 are preferably made of a light reflective material.

The second anode electrode 3, provided between the first anode electrode 2 and the hole injection layer 4, has a function to enhance the bonding force between the layers.

The hole injection layer 4 is preferably made of a metal compound such as a metal oxide, a metal nitride, or an oxynitride. When the hole injection layer 4 is made of a metal oxide, injection of holes is facilitated, which causes the electrons to contribute to the light emission effectively in the organic electroluminescent layer 7, and excellent light-emitting characteristics are obtained. As the metal oxide, an oxide of any of the following metals, for example, may be used: Cr (chrome), Mo (molybdenum), W (tungsten), V (vanadium), Nb (niobium), Ta (tantalum), Ti (titanium), Zr (zirconium), I-If (hafnium), Sc (scandium), Y (yttrium), Th (thorium), Mn (manganese), Fe (iron), Ru (ruthenium), Os (osmium), Co (cobalt), Ni (nickel), Cu (copper), Zn (zinc), Cd (cadmium), Al (aluminum), Ga (gallium), In (indium), Si (silicon), Ge (germanium), Sn (tin), Pb (lead), Sb (antimony), Bi (bismuth), and rare-earth elements ranging from La (lanthanum) to Lu (lutetium). In particular, $Al_2O_3$ (aluminum oxide), CuO (copper oxide), and SiO (silicon oxide) are effective in extending the life.

The banks 5 are preferably made of an organic material such as a resin, or an inorganic material such as glass. Examples of the organic material are an acryl-type resin, polyimide-type resin, and a novolac-type phenolic resin; and examples of the inorganic material are $SiO_2$ (silicon oxide) and $Si_3N_4$ (silicon nitride). It is preferable for the banks 5 to have a resistance to organic solvents, to allow visible light to pass to some extent, to be insulated, and to be made of a material that has a high resistance to the etching process, baking process and the like which may be performed thereon.

Note that the banks 5 may be pixel banks or line banks. When the banks 5 are pixel banks, the banks 5 are formed to surround the whole circumference of the organic electroluminescent layer 7 for each pixel. On the other hand, when the banks 5 are line banks, the banks 5 are formed to separate a plurality of pixels into columns or lines. In that case, the banks 5 are arranged to be on both sides of the organic electroluminescent layer 7 along the direction in which the columns or lines align, and the organic electroluminescent layer 7 is continuous in each column or line.

The hole transport layer 6 has a function to transport to the organic electroluminescent layer 7 holes that have been injected from the anode electrodes 2 and 3. The hole transport layer 6 is preferably made of poly(3,4-ethylenedioxythiophene) doped with polystyrene sulphonate (PEDOT-PSS), or the derivative (copolymer or the like) thereof.

The organic electroluminescent layer 7 has a function to emit light by using the electroluminescent phenomenon, and is preferably made of, for example, the functional material contained in the ink in one embodiment of the present invention.

The electron transport layer 8 has a function to transport to the organic electroluminescent layer 7 electrons that have been injected from the cathode electrode 9, and is preferably made of, for example, barium, phthalocyanine, lithium fluoride, or a mixture of any of these.

The cathode electrode 9 is made of, for example, ITO or IZO (Indium Zinc Oxide). In the case of a top-emission-type organic electroluminescent device, the cathode electrode 9 is preferably made of a light transmission material.

The sealing layer 10 has a function to prevent the organic electroluminescent layer 7 and the like from being exposed to water or air, and is made of, for example, SiN (silicon nitride) or SiON (silicon oxynitride). In the case of a top-emission-type organic electroluminescent device, the sealing layer 10 is preferably made of a light transmission material.

The organic electroluminescent device 111 and the organic display panel 110 having the above-described structure have excellent light-emitting characteristics because the organic electroluminescent layer 7 is formed from the ink that is excellent both in ejectability and flatness.

[Manufacturing Method of Organic Electroluminescent Device]

The following describes a manufacturing method of an organic electroluminescent device in one embodiment of the present invention with reference to FIGS. 16A-16G and FIGS. 17A-17E. FIGS. 16A-16G and FIGS. 17A-17E are process charts illustrating the manufacturing method of the organic electroluminescent device in one embodiment of the present invention.

First, the TFT substrate 1 whose upper surface is protected by the protective resist, as shown in FIG. 16A, is prepared.

Next, as shown in FIG. 16B, the protective resist covering the TFT substrate 1 is removed, the organic resin is applied by spin coating to coat the TFT substrate 1, and the patterning is performed by the PR/PE (Photo Resist/Photo Etching). This allows a flattening film 1a (which is, for example, 4 μm thick) to be formed, as shown in FIG. 16C.

Subsequently, the first anode electrodes 2 are formed on the flattening film 1a, as shown in FIG. 16D. The first anode electrodes 2 are formed by, for example, forming a thin film of APC by the sputtering, and performing the patterning by the PR/PE to form the thin film into a matrix (to be, for example, 150 nm thick). Note that the first anode electrodes 2 may be formed by the vacuum deposition or the like as well.

Next, as shown in FIG. 16E, the second anode electrodes 3 are formed in a matrix. The second anode electrodes 3 are formed by, for example, forming a thin film of ITO by the plasma deposition, and performing the patterning onto the thin film by the PR/PE (to be, for example, 110 nm thick).

Then, as shown in FIG. 16F, the hole injection layer 4 is formed on the second anode electrodes 3. The hole injection layer 4 is formed by, for example, applying, by the sputtering, a material that functions to inject holes, and performing the patterning by the PR/PE (to be, for example, 40 nm thick). Note that the hole injection layer 4 is formed not only on the second anode electrodes 3 but over the whole upper surface of the TFT substrate 1.

Next, as shown in FIG. 16G, the banks 5 are formed on the hole injection layer 4. The regions of the hole injection layer 4 on which the banks 5 are formed correspond to boundaries between regions on which the light-emitting layers are to be formed. The banks 5 are formed by forming a bank material layer to cover the whole upper surface of the hole injection layer 4, and removing a part of the formed bank material layer by the PR/PE (to be, for example, 1 μm thick). Note that the banks 5 may be line banks arranged in stripes extending only in the vertical direction, or may be pixel banks extending both in the vertical and horizontal directions to be as a whole in a lattice shape in a plan view.

Next, as shown in FIG. 17A, the hole transport layer 6 is formed by filling the concave portions between the banks 5 with ink containing the material of the hole transport layer, and drying the ink (to be, for example, 20 nm thick).

Subsequently, as shown in FIG. 17B, the organic electroluminescent layer 7 is formed by filling the concave portions between the banks 5 with the ink for the organic electroluminescent device in one embodiment of the present invention by the ink jet method (droplet ejection method) over the whole upper surface of the TFT substrate 1, drying the applied ink under reduced pressure, and baking (to have, for example, a thickness in a range from 60 nm to 90 nm). Note that the method for filling the ink into the portions between the banks 5 is not limited to the ink jet method, but may be the dispenser method, nozzle coating method, spin coating method, intaglio printing, relief printing or the like.

More specifically, the organic electroluminescent layer 7 is formed by performing the following first through fifth steps in sequence.

In the first step, the ink is prepared, and the ink is filled into the ink jet apparatus having a nozzle for the ink ejection.

In the second step, a substrate having a ground layer including the first electrode is prepared. In the present embodiment, the substrate corresponds to the TFT substrate 1 in which the first anode electrodes 2, the second anode electrodes 3, the hole injection layer 4, the banks 5, and the hole transport layer 6 have been formed.

In the third step, the ink jet apparatus is caused to eject droplets of the ink onto the hole transport layer 6. When the operation is performed, the third solvent is caused to evaporate from the ejected droplets of the ink to increase the viscosity of the ink.

In the fourth step, the droplets of the ink ejected in the third step are applied to the hole transport layer 6 to form a film of the droplets of the ink. When the operation is performed, the second solvent is caused to evaporate following the third solvent from the ejected droplets of the ink to further increase the viscosity of the ink.

In the fifth step, the ink droplet film is dried to form the organic electroluminescent layer 7.

Note that the third solvent may be caused to evaporate in the fourth step instead of in the third step. More specifically, the third solvent may be caused to evaporate in the fourth step from the ink droplets applied to the hole transport layer 6 to increase the viscosity of the ink.

Also, the third solvent may be caused to evaporate in the fifth step instead of in the third step. More specifically, the third solvent may be caused to evaporate in the fifth step by drying the ink droplet film to increase the viscosity of the ink. Furthermore, in the fifth step, the second solvent and the first solvent may be caused to evaporate in the stated order following the third solvent from the ink droplets by drying the ink droplet film to further increase the viscosity of the ink.

The timings at which the first, second, and third solvents are caused to evaporate can be controlled in accordance with the atmospheric environment.

Next, as shown in FIG. 17C, the electron transport layer 8 is formed (to be 20 nm thick) by the ETL deposition to cover the banks 5 and the organic electroluminescent layer 7.

Subsequently, as shown in FIG. 17D, the second electrode, which has a different polarity from the first electrode, is formed above the functional layer (the sixth step). More specifically, the cathode electrode 9 is formed (to be 100 nm thick) on the electron transport layer 8 by depositing a light transmission material onto the electron transport layer 8 by the plasma deposition.

Next, as shown in FIG. 17E, the sealing layer 10 is formed on the cathode electrode 9 by the CVD (to be 1 μm thick).

This completes the manufacture of the top-emission-type organic electroluminescent device.

[Organic Display Apparatus]

Figure 18:
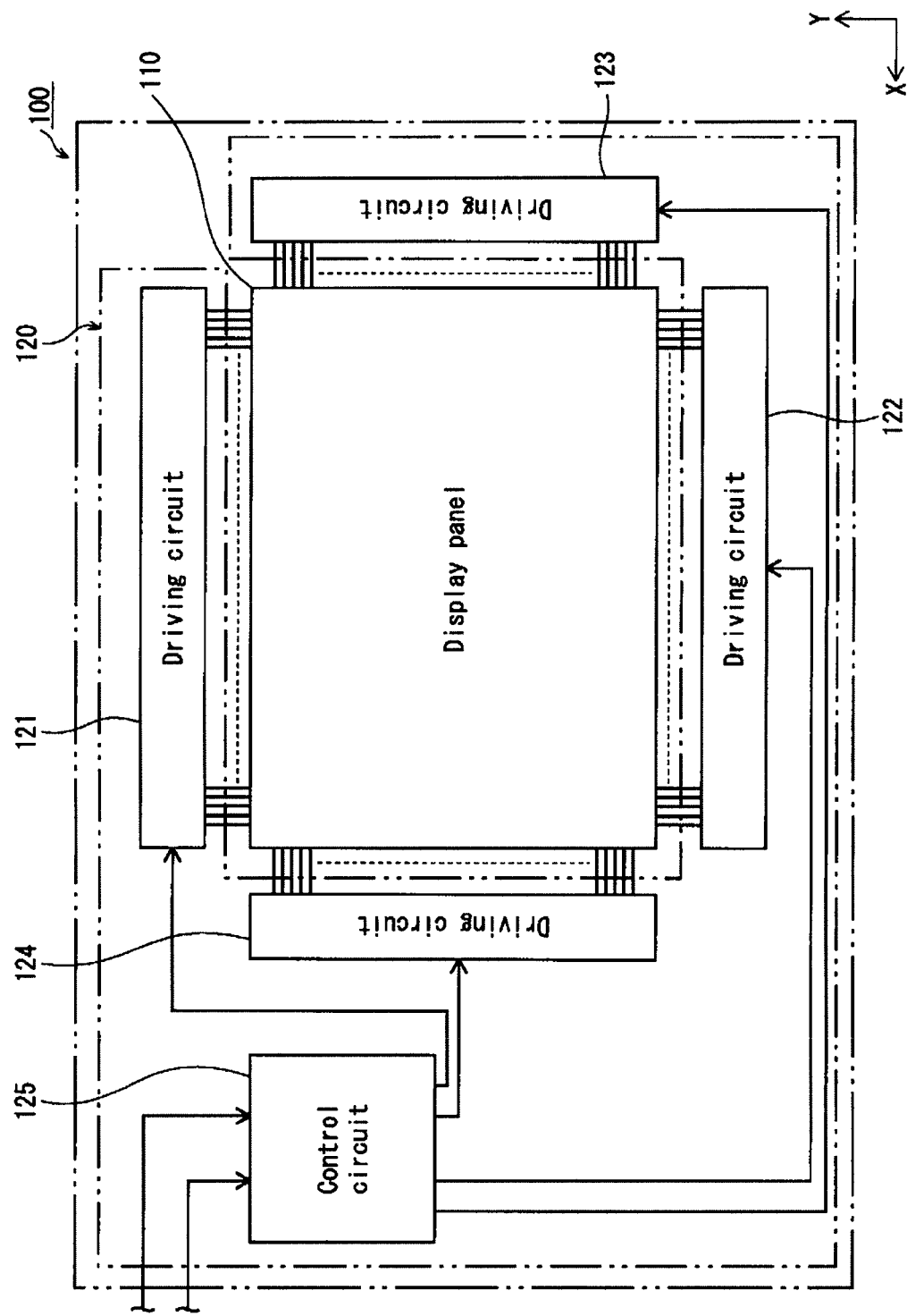
FIG. 18 shows the entire structure of the display apparatus in one embodiment of the present invention.
Figure 19:
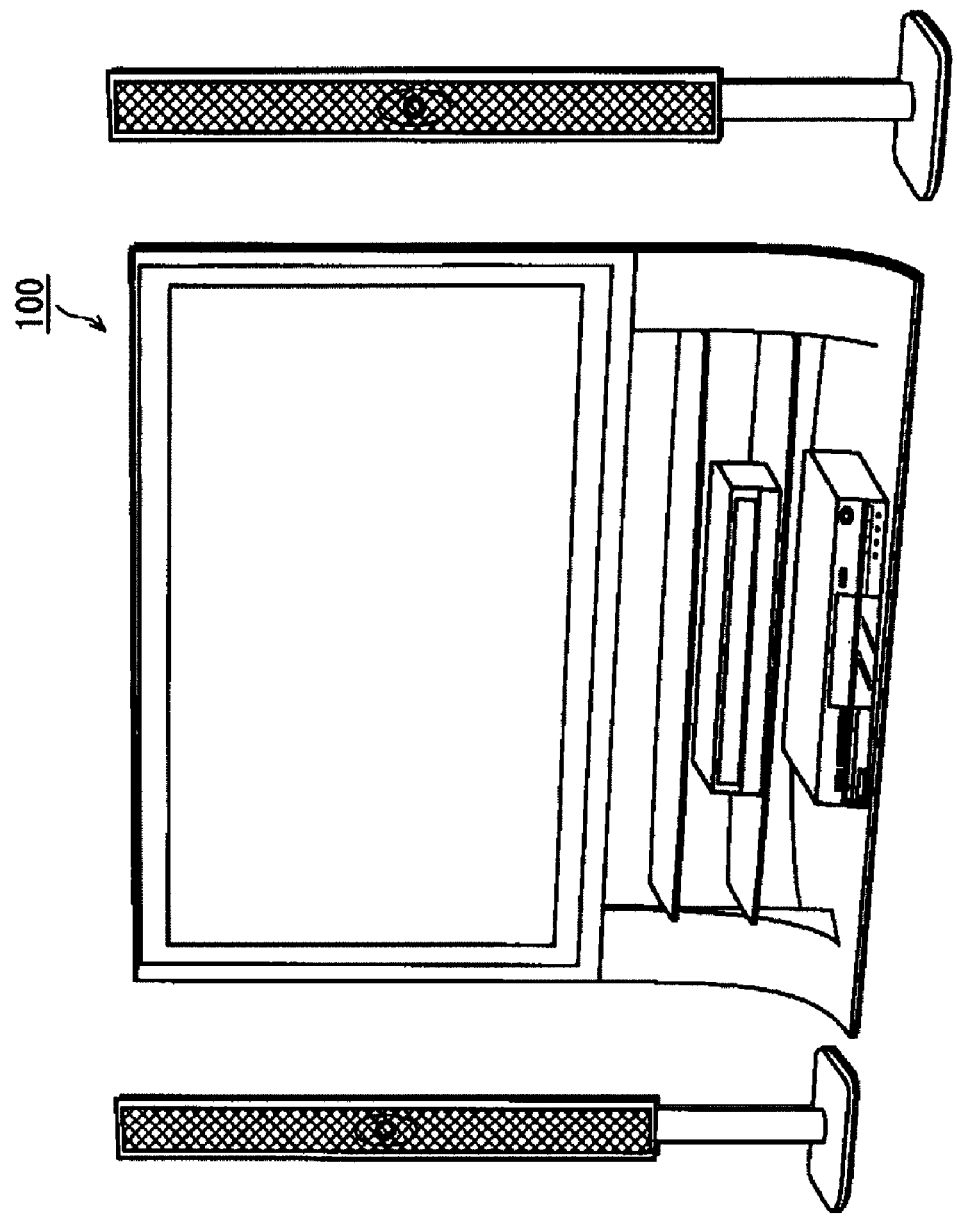
FIG. 19 is a perspective view showing a television system using the display apparatus in one embodiment of the present invention.

The following describes an organic display apparatus in one embodiment of the present invention with reference to FIGS. 18 and 19. FIG. 18 shows the entire structure of the display apparatus in one embodiment of the present invention. FIG. 19 is a perspective view showing a television system using the display apparatus in one embodiment of the present invention.

As shown in FIG. 18, an organic display apparatus 100 includes an organic display panel 110 in one embodiment of the present invention and a driving control unit 120 connected to the organic display panel 110. The driving control unit 120 is composed of four driving circuits 121-124 and a control circuit 125. Note that in the actual organic display apparatus 100, the arrangement or connection of the driving control unit 120 to the organic display panel 110 is not limited to the above one.

The organic display apparatus 100 structured as above displays high-quality images since it uses the organic electroluminescent device having excellent light-emitting characteristics.

[Organic Electroluminescent Apparatus]

FIGS. 20A and 20B show the organic electroluminescent apparatus in one embodiment of the present invention. FIG. 20A is a vertical cross-sectional view and FIG. 20B is a horizontal cross-sectional view. As shown in FIGS. 20A and 20B, an organic electroluminescent apparatus 200 includes a plurality of organic electroluminescent devices 210 in one embodiment of the present invention, a base 220 on which the organic electroluminescent devices 210 are implemented, and a pair of reflecting members 230 which are installed so as to have the organic electroluminescent devices 210 therebetween. Each of the organic electroluminescent devices 210 is electrically connected with an electrically conductive pattern (not illustrated) formed on the base 220, and emits light by the driving power supplied from the conductive pattern. The distribution of a part of the light emitted from the organic electroluminescent devices 210 is controlled by the reflecting members 230.

The organic display apparatus 200 structured as above displays high-quality images since it uses the organic electroluminescent device having excellent light-emitting characteristics.

[Modification Examples]

Up to now, ink for an organic electroluminescent device, manufacturing method of an organic electroluminescent device, organic display panel, organic display apparatus, organic electroluminescent apparatus, ink, forming method of a functional layer, and organic electroluminescent device in one embodiment of the present invention have been explained specifically. The above embodiment is one example used to explain the structure and acts/effects of the present invention. The present invention is not limited the above embodiment.

For example, the ink for an organic electroluminescent device in one embodiment of the present invention is not limited to the ink that is used to form the organic electroluminescent layer, but may be ink that is used to form a functional layer other than the organic electroluminescent layer, such as the hole transport layer, electron transport layer, hole injection layer, electron injection layer, or blocking layer.

Also, the organic electroluminescent device in one embodiment of the present invention is not limited to the top-emission type, but may be the bottom-emission type.

Furthermore, the organic display panel in one embodiment of the present invention is applicable not only to the one-color display but to the full-color display although the above embodiment does not refer to the color of the light emitted from the organic electroluminescent layer. In the organic display panel for the full-color display, the organic electroluminescent devices correspond to sub-pixels for each of the colors R, G, and B, wherein one pixel is formed from sub-pixels for R, G, and B that are adjacent to each other, and an image display area is constituted from a plurality of such pixels arranged in a matrix.

Also, the ink in one embodiment of the present invention is not limited to ink for an organic electroluminescent device, but may be ink for inorganic electroluminescent device.

INDUSTRIAL APPLICABILITY

The ink for an organic electroluminescent device in one embodiment of the present invention can be widely used in the manufacturing process of the organic electroluminescent device by the wet process. Also, the organic electroluminescent device in one embodiment of the present invention can be widely used, for example, in the passive-matrix-type or active-matrix-type organic display apparatus, or in the general field of the organic display apparatus.

What is claimed is:

1. An ink for an organic electroluminescent device, comprising:
   a functional material for forming a functional layer of the organic electroluminescent device;
   a first solvent for dissolving the functional material;
   a second solvent that has a diester backbone and a second boiling point that is one of at most equal to a first boiling point of the first solvent or greater than the first boiling point of the first solvent by at most 20° C.; and
   a third solvent that is an aliphatic alcohol and has a third boiling point that is less than the first boiling point of the first solvent and less than the second boiling point of the second solvent.

2. The ink for the organic electroluminescent device of claim 1, wherein the ink is configured to transition, in an atmospheric environment, from a first state that includes the first solvent, the second solvent, and the third solvent to a second state that includes the first solvent and the second solvent in response to the third solvent evaporating, and from the second state to a third state that includes the first solvent in response to the second solvent evaporating.

3. The ink for the organic electroluminescent device of claim 1, wherein a viscosity of the ink in a state that includes the first solvent, the second solvent, and the third solvent is at least approximately 3 mPa·s and at most approximately 20 mPa·s.

4. The ink for the organic electroluminescent device of claim 3, wherein a viscosity of the ink in a state that includes the first solvent, the second solvent, and the third solvent is at least approximately 3 mPa·s and at most approximately 13 mPa·s.

5. The ink for the organic electroluminescent device of claim 1, wherein a viscosity of the ink in a state that includes the first solvent and the second solvent after the third solvent evaporates is at least approximately 20 mPa·s and at most approximately 200 mPa·s.

6. The ink for the organic electroluminescent device of claim 5, wherein a viscosity of the ink in a state that includes the first solvent and the second solvent after the third solvent evaporates is at least approximately 30 mPa·s and at most approximately 200 mPa·s.

7. The ink for the organic electroluminescent device of claim 1, wherein a mixture ratio of the second solvent to a sum of the second solvent and the third solvent is at least approximately 30 mol % and at most approximately 70 mol %.

8. The ink for the organic electroluminescent device of claim 1, wherein a mixture ratio of a first sum of the second solvent and the third solvent to a second sum of the first solvent, the second solvent, and the third solvent is at least approximately 3 mol % and at most approximately 20 mol %.

9. The ink for the organic electroluminescent device of claim 1, wherein the first solvent is phenoxy toluene, the second solvent is dimethyl phthalate, the third solvent is 1-nonanole, and the functional material is F8-F6.

10. The ink for the organic electroluminescent device of claim 1, wherein the first boiling point of the first solvent is at least approximately 260° C. and at most approximately 350° C., the second boiling point of the second solvent is at least approximately 280° C. and at most approximately 350° C., and the third boiling point of the third solvent is at least approximately 80° C. and at most approximately 250° C.

11. The ink for the organic electroluminescent device of claim 1, wherein a concentration of the functional material is at least approximately 0.1 wt % and less than approximately 4 wt %.

* * * * *